US007646634B2

(12) United States Patent  
Schumacher

(10) Patent No.: US 7,646,634 B2  
(45) Date of Patent: Jan. 12, 2010

(54) MAGNETIC MEMORY DEVICE AND METHOD OF MAGNETIZATION REVERSAL OF THE MAGNETIZATION OF AT LEAST ONE MAGNETIC MEMORY ELEMENT

(75) Inventor: Hans Werner Schumacher, Vechelde (DE)

(73) Assignee: Bundesrepublik, Deutschland, Vertreten Durch das Bundesministerium fur Wirtschaft und Arbeit, Dieses Vertreten Durch Den Prasidenten der Physikalisch-Technischen Bundesanstalt Braunschweig und Berlin, Braunschweig (DE)

( * ) Notice: Subject to any disclaimer, the term of this patent is extended or adjusted under 35 U.S.C. 154(b) by 229 days.

(21) Appl. No.: 11/813,949

(22) PCT Filed: Dec. 29, 2005

(86) PCT No.: PCT/EP2005/014108  
§ 371 (c)(1),  
(2), (4) Date: Jul. 13, 2007

(87) PCT Pub. No.: WO2006/074810  
PCT Pub. Date: Jul. 20, 2006

(65) Prior Publication Data  
US 2008/0043518 A1 Feb. 21, 2008

(30) Foreign Application Priority Data  
Jan. 14, 2005 (EP) .................................. 05000667

(51) Int. Cl.  
*G11C 11/14* (2006.01)

(52) U.S. Cl. .................. 365/171; 365/158; 365/173; 365/148; 977/935

(58) Field of Classification Search ............. 365/66, 365/80–85, 100, 148, 158, 171, 173, 225.5, 365/243.5; 257/421, E21.665; 438/3; 977/933–935  
See application file for complete search history.

(56) References Cited

U.S. PATENT DOCUMENTS 3,163,853 A 12/1964 Belson ...................... 349/174  
6,483,741 B1 11/2002 Iwasaki et al. ............. 365/170

6,545,906 B1 * 4/2003 Savtchenko et al. ......... 365/158

FOREIGN PATENT DOCUMENTS

WO    WO 99/62069       5/1999  
WO    WO 00/77776 A1    6/1999

OTHER PUBLICATIONS

Schumacher et al. Coherent Suppression of Magnetic Ringing in Microscopic Spin Valve Elements, Applied Physics Letters, vol. 80, No. 20, May 20, 2002, pp. 3781-3783 Schumacher et al., Quasiballistic Magnetization Reversal, Physical Review Letters, vol. 90, No. 1, Jan. 10, 2003, pp. 017204-1 to 017204-4.

(Continued)

*Primary Examiner*—Richard Elms  
*Assistant Examiner*—Harry W Byrne  
(74) *Attorney, Agent, or Firm*—Whitham Curtis Christofferson & Cook, PC

(57) ABSTRACT

Method of magnetization reversal of the magnetization (M) of at least one first magnetic memory element of an array of magnetic memory elements comprising the steps of: applying a first magnetic field pulse to a first set of magnetic memory elements, and applying a second magnetic field pulse to a second set of magnetic memory elements, such that during the application of the first and second magnetic field pulse the magnetization (M) of said first magnetic memory element which is to be reversed upon the field pulse decay performs approximately an odd number of a half precessional turns, wherein the magnetization (M) of at least one second magnetic memory element which is not to be reversed upon the field pulse decay performs approximately a number of full precessional turns. The underlying concept of the invention is to improve the bit addressing in an array of magnetic memory cells by reducing the ringing of the magnetization of the free layer of the magnetic cells which are not selected for reversal but which are nevertheless subject to the application of a magnetic field pulse. This can be achieved by applying a field pulse to these cells which induces approximately a full precessional turn of the magnetization of the free layer of the cells. After the full precessional turn the magnetization is oriented very near the initial orientation along the easy axis of magnetization and the magnetic ringing after application of the half select field pulse is reduced.

9 Claims, 21 Drawing Sheets

OTHER PUBLICATIONS

Figure 1:
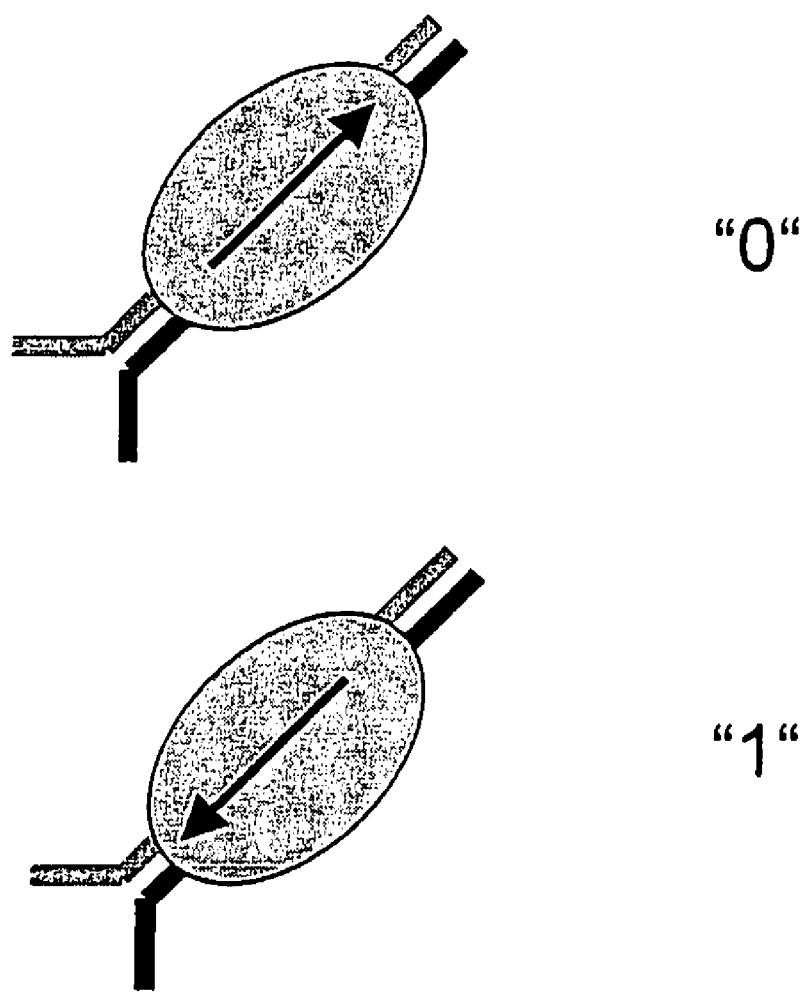

Krichevsky et al., Precessional Switching of a 3×1 micrometer Elliptical Element in a Crossed-wire Geometry, Journal of Applied Physics, vol. 95, No. 11, Jun. 1, 2004, pp. 6601-6603 Schumacher et al., Phase Coherent Precessional Magnetization Reversal in Microscopic Spin Valve Elements, Physical Review Letters, vol. 90, No. 1, Jan. 10, 2003, pp. 017201-1 017201-4.

* cited by examiner

MAGNETIC MEMORY DEVICE AND METHOD OF MAGNETIZATION REVERSAL OF THE MAGNETIZATION OF AT LEAST ONE MAGNETIC MEMORY ELEMENT

This invention relates to a method of magnetization reversal of the magnetization (M) of at least one first magnetic memory element of an array of magnetic memory elements comprising the steps of:
 applying a first magnetic field pulse to a first set of magnetic memory elements, and
 applying a second magnetic field pulse to a second set of magnetic memory elements, such that during the application of the first and second magnetic field pulse the magnetization (M) of said first magnetic memory element which is to be reversed upon the field pulse decay performs approximately an odd number of a half precessional turn.

The invention further relates to a magnetic memory device comprising an array of a plurality of magnetic memory elements each magnetic memory element having an easy axis of magnetization (M), the memory element comprising a first conductive line (BL) for generating a magnetic field at least one magnetic memory element, a second conductive line (WL) for generating a second magnetic field at the at least one magnetic memory element.

Magnetic random access memories (MRAM) are semiconductor memory devices including an array of magnetic cells in which each bit of information is stored in the orientation of the magnetic moment M of a magnetic storage layer (also called magnetic free layer FL) of the respective magnetic cell. The free layer FL has a magnetic anisotropy and an easy axis of magnetization.

One advantage of such MRAM devices is that the information stored in the magnetic cell is non-volatile i.e. the information is persistently stored in the cell even in the case of power off of the device. A further advantage of such MRAM is that they are potentially fast as the magnetization reversal of the free layer FL of a cell can occur within time scales of a few hundred picoseconds or faster.

The read-out of the state of the cell (i.e. of the digital state "0" or "1") generally occurs by means of magneto-resistance measurements. Magneto-resistive effects that allow such magneto-resistive read-out are the tunnelling magneto resistance (TMR), the giant magneto resistance (GMR), the colossal magneto resistance (CMR), and the anisotropic magneto resistance (AMR), among others. The two most commonly used effects in today's MRAM prototypes are the TMR and the GMR. Here, the magnetic cell comprises a magnetic free layer FL, a coupling layer CL and a pinned magnetic layer PL. The coupling layer CL is situated between the free layer FL and the pinned layer PL and consists e.g of a non-magnetic conductor in the case of a GMR cell or of an insulator in the case of a TMR cell. The magneto-resistance then depends on the relative orientation of the magnetization M of the free layer FL and of the pinned layer PL. The free layer FL and the pinned layer PL generally have different coercive fields to allow programming of the magnetization of the two layers into a parallel or antiparallel state by means of magnetic fields. In most cases the coercive field of the pinned layer PL is strongly increased by coupling to an antiferromagnetic layer. Other layers can be incorporated into the cell stack to improve the magnetic and magneto-resistive properties as known in the art.

Programming of the cells is generally obtained via two sets of metallization lines, the so-called word lines WL and bit lines BL. Passing a current pulse through the word and bit lines generates a magnetic field pulse according to Ampèere's law which is used to switch the magnetization of the cells.

In the simplest case the cells are arranged in an array. The bit lines BL1-BLn and the word lines WL1-WLm (n,m are integer numbers) are arranged in columns and rows, respectively. The magnetic cells are situated at each intersection of the word lines WL and bit lines BL. A vital question for the operation of an MRAM is a reliable bit addressing. This bit addressing (i.e. the selection of a certain cell for switching) is achieved by applying two so-called "half-select" magnetic field pulses via the word and bit lines. The half-select fields generated by the word line WL, only or by the bit line BL, only are not sufficient to change the orientation of the magnetization M of the free layer FL of the cell. Only the superposition of the two half select fields of the word and bit line at the intersection of the two lines is sufficient to switch the magnetization M and thus to program the cell.

The problem of such prior art bit addressing is that the currents have to be applied for a rather long time of at least several nanoseconds to achieve a reliable reversal of the magnetization of the selected cell. A long field application results in high power consumption and low device write clock rates. Furthermore the relaxation of the magnetization M in the half selected cells from the tilted position towards the final orientation along the easy axis can take several nanoseconds which also limits the clock rate of the write operation. Additionally, in the half-select case the tilt of the magnetization M leads to a reduced energy barrier for the magnetization reversal which can induce unintentional programming of a half-selected cell.

In U.S. Pat. No. 3,163,853 and WO 00/77776 a method of magnetization reversal by mainly transverse magnetic fields is proposed which allows ultra fast magnetization reversal by field pulses shorter than 1 ns. This method uses the precession of the magnetization M during the application of a fast rising magnetic field pulse which is oriented mainly transverse to the initial easy axis orientation of the magnetization M.

WO 99/62069 and U.S. Pat. No. 6,483,741 disclose the use of this so-called precessional switching to the magnetization reversal in MRAMs.

Precessional switching is based on the fast dynamics of the magnetization M upon application of a fast rising magnetic field pulse H. The fast time evolution dM/dt of the magnetization M due to an effective field is described by the Landau-Lifshitz-Gilbert (LLG) equation $$\frac{dM}{dt} = -\gamma(M \times H_{eff}) + \frac{\alpha}{M_S}\left(M \times \frac{dM}{dt}\right). \quad \text{Equation 1}$$

In equation 1 $\gamma$ is the gyromagnetic ratio, $\alpha$ is the Gilbert damping parameter, $M_S$ is the saturation magnetization of the magnetic sample, and $H_{eff}=H_{app}+H_{int}$ is the effective field i.e. the sum of the applied field $H_{app}$ and the internal fields $H_{int}$ which result from the various magnetic anisotropies of the magnetic free layer (e.g. uniaxial anisotropy, four-fold anisotropy, surface and interface anisotropies, magnetocrystalline anisotropies, etc.) and of the shape of the sample. The first term on the right hand side of the LLG equation describes the torque on the magnetization upon application of an effective field $H_{eff}$ which leads to a precessional motion of the magnetization about the field. The second term describes the damping of the precession which eventually induces an alignment of the magnetization M along the effective field $H_{eff}$. It is clear from the first term on the right hand side of the LLG equation that the torque on the magnetization M is maximum when the effective field is oriented perpendicular (or transverse) to the magnetization. This effect is used for precessional switching where a short and fast rising field transverse field pulse is applied to induce magnetization reversal.

A memory array layout for the generation of such transverse field pulses is disclosed in U.S. Pat. No. 6,483,741. This prior art memory array is sketched in FIGS. 9 and 10. In this layout the magnetic cells and thus the easy axis of the magnetic cells are tilted by 45° with respect to the word lines WL rows and bit lines BL columns. In one case of a half selected cell, the word line pulse current IWL creates a word line half select field $H_{HS,WL}$ oriented in a 135° degree angle to the initial magnetization M (FIG. 10a). For a second case of a half selected cell, the bit line current IBL creates a bit line half select field $H_{HS,BL}$ oriented in a 45° angle to the initial magnetization (FIG. 10b). In this array layout the angle between the applied word line field or bit line field depends on the initial orientation of the magnetization M along the easy axis of magnetization of the cell and can take the two values of 45° or 135°. For a full selected cell, which is selected for switching the resulting field is oriented in a transverse direction leading to an optimum torque on the magnetization M (FIG. 10c).

In the prior art for precessional switching of the magnetization of an MRAM cell the parameters of the current pulses along the word and bit line and thus the parameters of the magnetic field pulses at the cells are only optimized to obtain fast magnetization reversal of the selected cell. The fastest possible reversal mode is the so-called ballistic magnetization reversal. In this ballistic magnetization reversal the pulse duration $T_{Pulse}$ of the full select switching field pulse $H_{FS}$ approximately equals the half of the precession period: $T_{Pulse} = \frac{1}{2} \cdot T_{Prec}(H_{FS})$. During this half of the precession period of the magnetization M performs a 180° rotation about the effective field (i.e. a half precessional turn), overcomes the hard axis, and switches directly from the initial to the reversed easy axis orientation. Upon pulse termination the magnetization M is oriented along the reversed easy axis direction i.e. in the final reversed equilibrium position. Such an optimized prior art switching pulse and the corresponding magnetization trajectory is shown in FIG. 11c.

The full select pulse $H_{FS}$ shown in the upper panel is generated by the superposed word and bit line fields. It is oriented perpendicular to the initial direction of M along the in plane hard axis (i.e. along the y-axis) as discussed above. The time evolution of the pulse field is plotted in the upper panel and the time evolution of the components of M is plotted in the lower panel. The duration of the word and bit line pulses is 435 ps (measured at the half maximum of the amplitude) and the rise and fall times are 100 ps. The amplitude of the 45° tilted half select word and bit line pulses $|H_{HS}|=|H_{HS, WL/BL}|=48.8$ Oe. The resulting amplitude of the transverse full select pulse is $H_{FS}=\sqrt{2} \cdot H_{HS}=69$ Oe. The duration and rise and fall times of the full select pulse are the same as for the half select pulses. The delay between the two half select pulses is zero. These pulse parameters are optimized for ballistic magnetization reversal. The hard axis field pulse shown in the upper panel leads to ballistic magnetization reversal and the easy axis magnetization component $m_x$ changes sign. During pulse application of the full select pulse M turns from the initial negative orientation M=(−1, 0, 0) to the positive orientation M=(1, 0, 0). Upon pulse decay (arrow) M is oriented very near the reversed easy axis and practically no relaxation of M occurs. As the magnetization M is already in equilibrium upon pulse termination (see FIG. 11c, arrow) no final ringing occur and the reversed state is immediately fully stabilized. The pulse parameters induce and optimum ultra fast reversal of the selected cell c (FIG. 10). For the parameters given here the switching is symmetric. Repeated application of this hard axis pulse toggles the magnetization from one easy axis orientation to the other.

In the prior art precessional switching of a MRAM cell the field pulses are however only optimized to obtain optimum ballistic magnetization reversal of the cell which is selected for reversal. A strong ringing of the magnetization however occurs in those cells which are not selected for reversal. Such ringing of the magnetization of the half select cells upon the decay of the field pulse may persist for several nanoseconds, thereby limiting MRAM performance.

The problem of ringing is disclosed e.g. in H. W. Schumacher et al: "Coherent suppression of magnetic ringing in microscopic spin valve elements", in: Applied Physics Letters, 80, 3781 (2002). It is shown in this document, that also in a magnetic memory cell the precession about a strong external static field upon application of a short magnetic field pulse can be suppressed by pulse tailoring H. W. Schumacher et. al.: "Phase Coherent Precessional Magnetization Reversal in Microscopic Spin Valve Elements", in: Physical Review Letters, Vol. 90, No. 1, (2003) and H. W. Schumacher et. al.: "Quasibalistic Magnetization Reversal", in: Physical Review Letters, Vol. 90, No. 1, (2003) presents studies on optimum ballistic switching. The papers deal mainly with the optimization of the switching parameters for ultra fast precessional switching.

M. R. Freeman and A. Krichevsky: "Precessional switching of a 3×1 micrometer elliptical element in a crossed wire geometry", in: Journal of Applied Physics, Vol. 95, No. 11, June 2004, p. 6601 to 6603, study switching of an MRAM cell where the half select pulse applied to the to be reversed memory cell is slow compared to the full select switching of the not to reversed memory cells.

This ringing of the magnetization created by the prior art magnetic memory bit selection scheme creates several problems. During the decay of the ringing the magnetization M is not in a well defined stated. The pulse parameters for switching are however only optimized for switching from a well defined initial orientation of the magnetization M along the easy axis. Before application of a further full select switch pulse one has to wait for several nanoseconds until the magnetization ringing has damped down. Furthermore, the application of a half-select pulse to a cell which still shows a strong magnetization ringing can lead to unwanted programming of the half selected cell and thus to a loss of the stored information. As the damping of the ringing can take several nanoseconds the write clock rate of the magnetic memory is thus limited to the MHz regime.

Another problem of the prior art is that during the time of the magnetization ringing it is not possible to read out the state of the cell as the direction of the magnetization M is not well defined and thus the read out resistance value is not well defined. One thus has to wait until the ringing of all cells of the cell array has damped down before the read-out of the stored information can be performed. Therefore also the access time of the magnetic memory device is also limited to read rates in the MHz regime.

A further problem of the prior art is that during the ringing the magnetization is in a highly excited state. These strong excitations along with slight perturbations e.g. from thermal activation or from stray fields from neighbouring cells can lead to unwanted programming of a half select cell and thus to the loss of stored information of the magnetic memory device.

Another problem of the prior art is that the decay of the ringing inevitably leads to an increase of the cell temperature and to a high heat load to the magnetic memory device which hinders a high device integration.

It is therefore an object of the present invention to provide an improved method of magnetization reversal of a magnetic memory cell in an array of magnetic memory cells ("bit addressing") and an improved magnetic memory device.

The object of the invention is achieved by the features of the enclosed independent claims. Various modifications and improvements are contained in the dependent claims.

According to the invention, the magnetization of at least one second magnetic memory element which is not to be reversed upon the field pulse decay performs approximately an even number of a full precessional turn.

The underlying concept of the invention is to improve the bit addressing in an array of magnetic memory cells by reducing the ringing of the magnetization of the free layer of the magnetic cells which are not selected for reversal but which are nevertheless subject to the application of a magnetic field pulse. This can be achieved by applying a field pulse to these cells which induces approximately a full precessional turn of the magnetization of the free layer of the cells. After the full precessional turn the magnetization is oriented very near the initial orientation along the easy axis of magnetization and the magnetic ringing after application of the half select field pulse is reduced.

The range of the approximate half precessional turn is about 0.4 to 0.6 of a full precessional turn (~140° to 260°) and a full precessional turn is in the range of about 0.9 to 1.1 of a 360° turn (~320° to 400°). More preferably, the half precessional turn is about 0.45 to 055 of a full precessional turn (~160° to 200°). Further, the full precessional turn is preferably in the range of about 0.95 to 1.05 of a 360° turn (~340° to 380°). Still more preferably, the half precessional turn is about 0.48 to 0.52 (~170° to 190°) of a full precessional turn and/or the full precessional turn is about 0.98 to 1.02 (~350° to 370°).

The object is further achieved by the magnetic memory device in that in the vicinity of said magnetic memory element said first and said second conductive lines are aligned parallel to the easy axis of magnetization of said magnetic memory element. This results also in the magnetization of at least one second magnetic memory element which is not to be reversed upon the field pulse decay performs approximately an even number of a full precessional turn.

The method and the memory device result in a reduced risk of unwanted reversal the magnetization of cells which are not selected for magnetization reversal. Further, the heat load to the magnetic memory cells is reduced. Another advantage of the method and memory device is, that it allows higher magnetic memory write and read out clock rates.

In a preferred embodiment, the first and second magnetic field pulses are designed such that the magnetic field pulses induce a full precessional turn of the magnetization of a free layer of a corresponding magnetic memory element and such that the superposition of at least the first and second field pulse induces a half precessional turn of the magnetization which reverses the magnetization of the free layer of the selected magnetic memory element. Thus, by applying at least two pulses to a respective first and second set of magnetic memory elements, these magnetic memory elements are reversed, which receives a superimposed effective field pulse provided for inducing a half precessional turn of the magnetization. In this embodiment, a set of magnetic memory elements is programmed at the same time by applying a plurality of first and second magnetic field pulses to the array of magnetic memory elements, wherein the magnetic field pulses are applied such that the magnetization of the magnetic memory elements which are to be reversed performs a half precessional turn during field pulse application and the magnetization of the magnetic memory elements which are not to be reversed performs a full precessional turn during the magnetic field pulse application.

In a preferred embodiment, the precession period of the magnetization under application of an magnetic field pulse which does not reverse the magnetization of the magnetic memory element approximately matches the half of the precession period of the magnetization under application of an effective magnetic field pulse which does reverse the magnetization of the magnetic memory element.

The precession period mismatch $\Delta T = \frac{1}{2} \cdot T_{Prec}(H_S) - T_{Prec}(H_{NS})$ being the difference between the half of the duration of said first precession period $\frac{1}{2} \cdot T_{Prec}(H_S)$ and the duration of said full precession period $T_{Prec}(H_{NS})$ should be shorter than 100 ps ($\Delta T < 100$ ps) and more preferably less than 100 ps, e.g. less than 50 ps, 20 ps or 10 ps.

The pulse duration of the field pulses for reversing the magnetization (M) and/or for non reversing the magnetization are preferably matched approximately to the duration of the half precession period at the field which induces magnetization reversal. Further, parameters of the magnetic field pulses can be adapted to the properties of the free layer of the magnetic memory element in order to improve the induction of a half precessional turn for a to be reversed magnetic memory element and of a full precessional turn for a not to be reversed magnetic memory element.

The adapted parameters of the magnetic field pulses can e.g. be the amplitudes of the field pulses, the orientation of the field pulses with respect to the easy axis of the magnetic memory element, the pulse durations of the magnetic field pulses, the rise and fall times of the field pulses, the shape of the field pulses, and/or the delay time between the application of superimposed field pulses.

Furthermore, the properties of the free layer FL are adapted in a preferred embodiment such, that the magnetization of at least one first magnetic memory element which is to be reversed upon the field pulse decay performs approximately an odd number of a half precessional turn and that the magnetization of at least one second magnetic memory element which is not to be reversed upon the field pulse decay performs approximately a even number of a full precessional turn.

The adapted parameters of the free layer can e.g. be the saturation magnetization, the thickness of the free layer, the shape of the magnetic memory element, and/or the material dependent anisotropies of the magnetic free layer.

By the use of pulse tailoring the ringing of the magnetization M of a free layer FL in a magnetic memory element which is not selected for magnetization reversal can be suppressed in order to improve the bit addressing in an array of magnetic memory elements.

In a preferred first embodiment the magnetic field pulses are preferably oriented perpendicular to the initial and final easy axis of magnetization of the magnetic memory elements of the array. This results in that the behaviour of the magnetization to the application of the field pulse is symmetric for the two initial orientations of the magnetization along the easy axis of magnetization. In other words a half select field pulse that induces a full precessional turn of the magnetization about the effective field for one initial orientation of the magnetization will also induce a full precessional turn of the magnetization about the effective field for the other initial orientation of the magnetization and vice versa. Furthermore, as the fields of the first and second conductive lines are both oriented perpendicular to the easy axis of the cells also the role of the field pulses created by the first and second conductive lines (bit and word line) can be exchanged.

Optimizing the switching parameters of a set of magnetic memory elements in an array of magnetic memory elements can be done by:
- determining the precession period of a first magnetic memory element of an array of magnetic memory elements upon application of a first magnetic field pulse,
- determining the precession period of a second magnetic memory element of an array of magnetic memory elements upon application of a second magnetic field pulse,
- determining the precession period mismatch being the difference between the half of the duration of the first precession period upon application of the first magnetic field pulse and the duration of the full precession period upon application of the second magnetic field pulse, and
- determining the parameters for the first and second magnetic field pulses for which the precession period mismatch is shorter than 100 ps.

In another preferred embodiment of the magnetic memory device comprising an array of first and second conductive lines, said second conductive line is aligned parallel to the easy axis of magnetization of said magnetic memory element and the first conductive line is aligned perpendicular to the easy axis of magnetization of said magnetic memory element in the vicinity of said magnetic memory element. In order to program a plurality of magnetic memory elements at the same time, a plurality of first conductive lines is arranged in parallel to each other and a plurality of second conductive lines arranged in parallel to each other, wherein the first conductive lines extend perpendicular to the second conductive lines, so that the first and second conductive lines are arranged in rows and columns. Said embodiment comprises means for applying a set of electrical pulses simultaneously to the set of first conductive lines and at least one electrical pulse to at least one of said set of second conductive lines, wherein the pulse duration is less than 10 ns, more preferably 5 ns and most preferably 0.5 ns and less. It is most preferably when the time axis of the pulse duration lies within the precession period, e.g. in the range of 1 ns or even shorter. In the general case some magnetic memory elements of the word are thus programmed to a new digital state and some are reprogrammed to the same digital state—depending on the initial and final memory content of the word to be programmed. Consequently in some cases the magnetization of the magnetic memory element will be reversed after programming and in some cases the magnetization will not be reversed. In this embodiment of the present invention the magnetic field pulses are applied such that the magnetization of the magnetic memory elements which are to be reversed performs a half precessional turn during field pulse application and the magnetization of the magnetic memory elements which are not to be reversed performs a full precessional turn during magnetic field pulse application.

Figure 2:
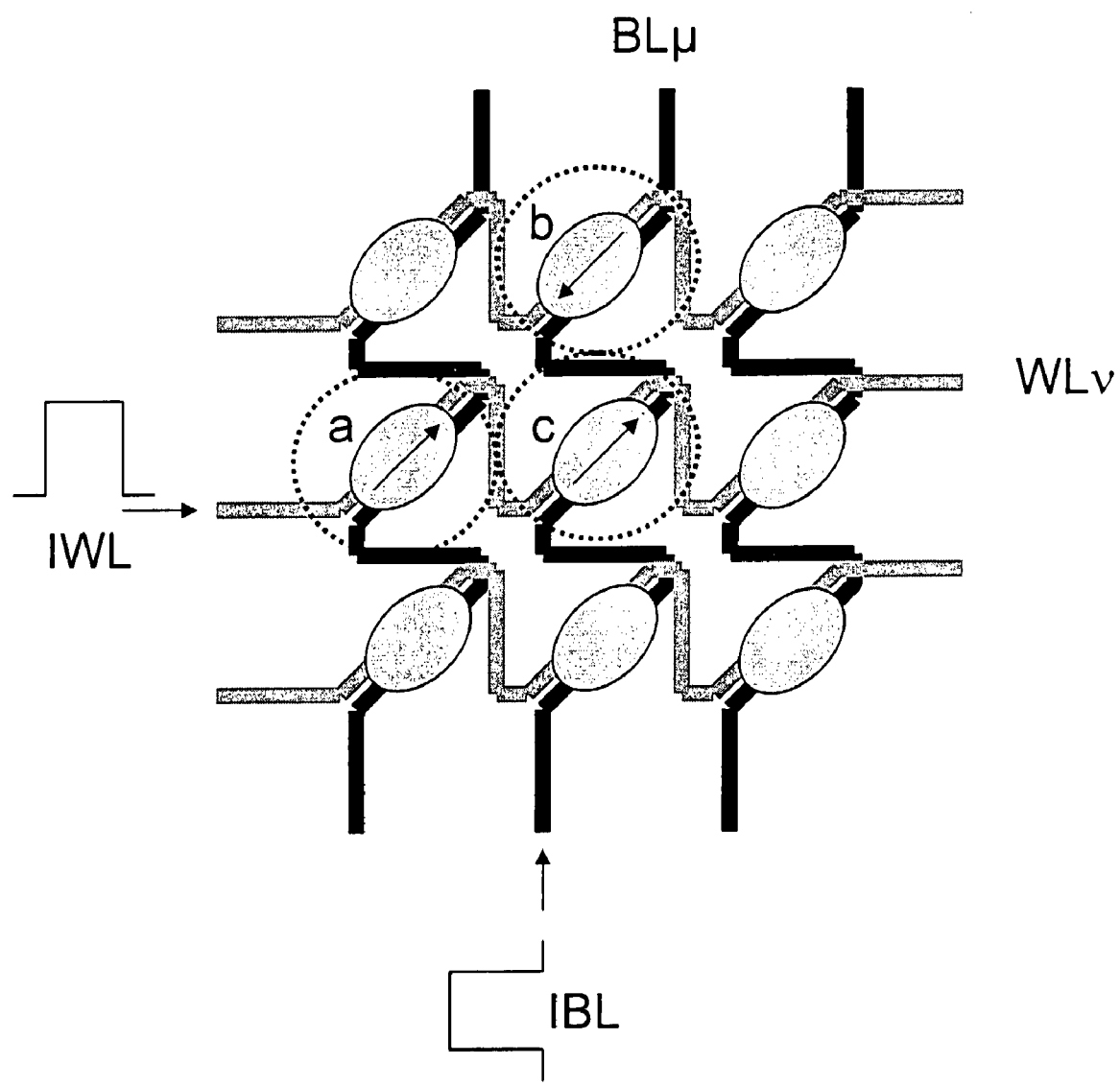
Figure 3:
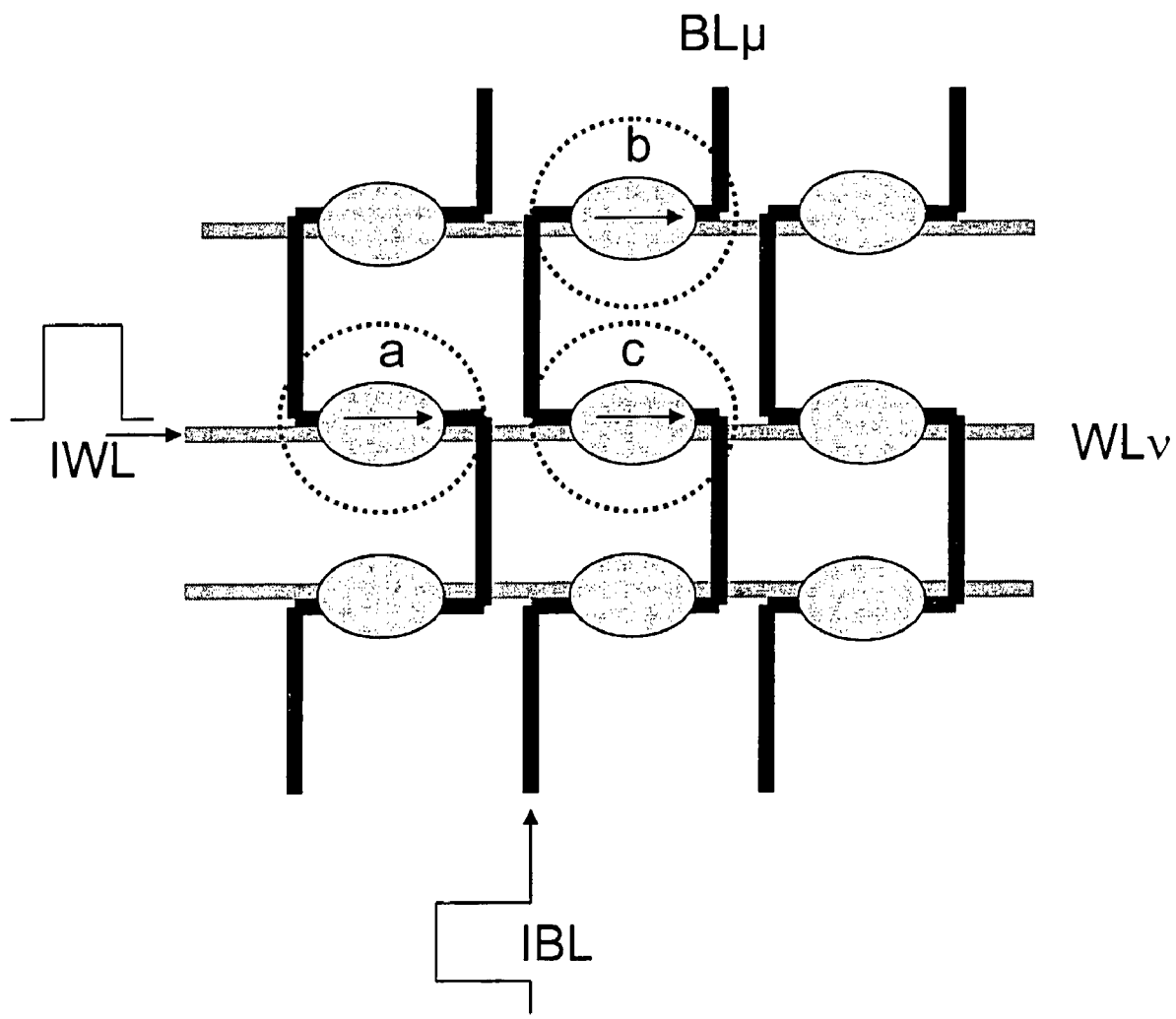
Figure 5:
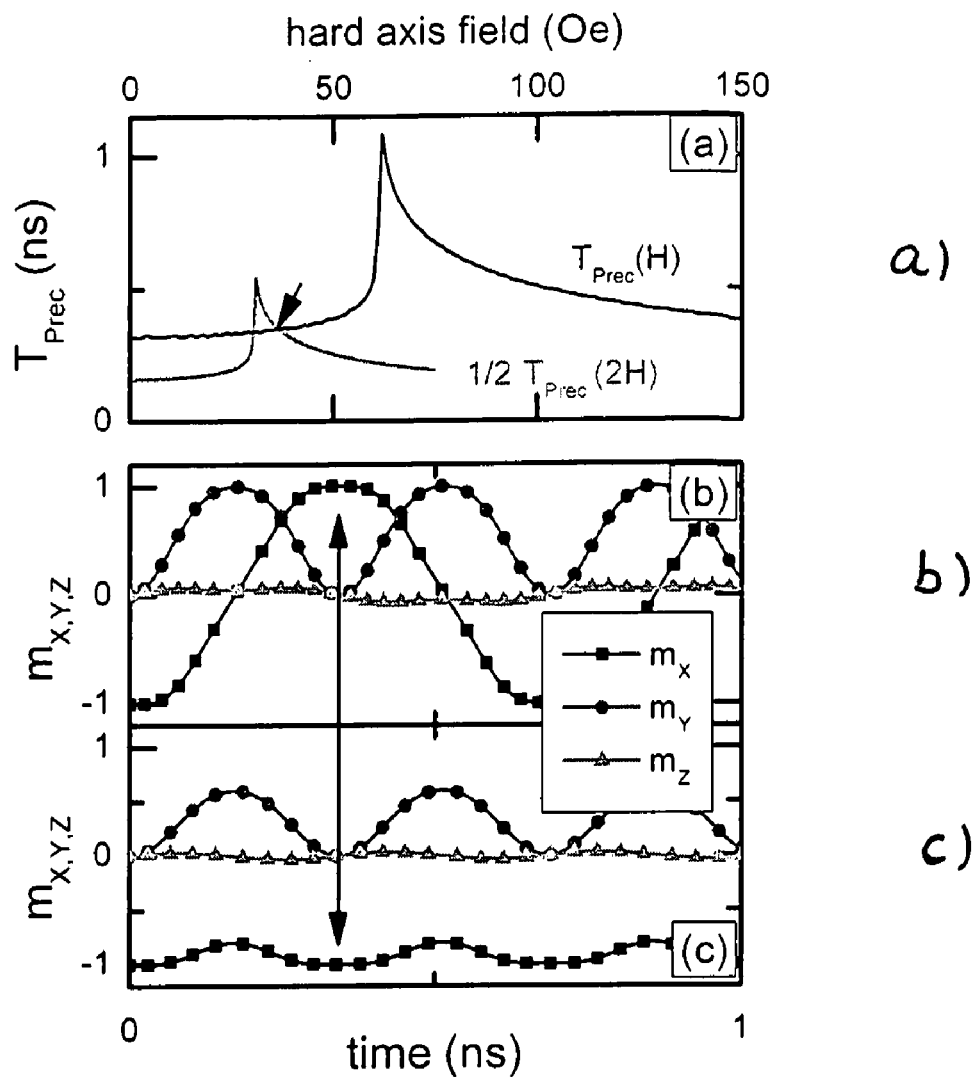
Figure 7:
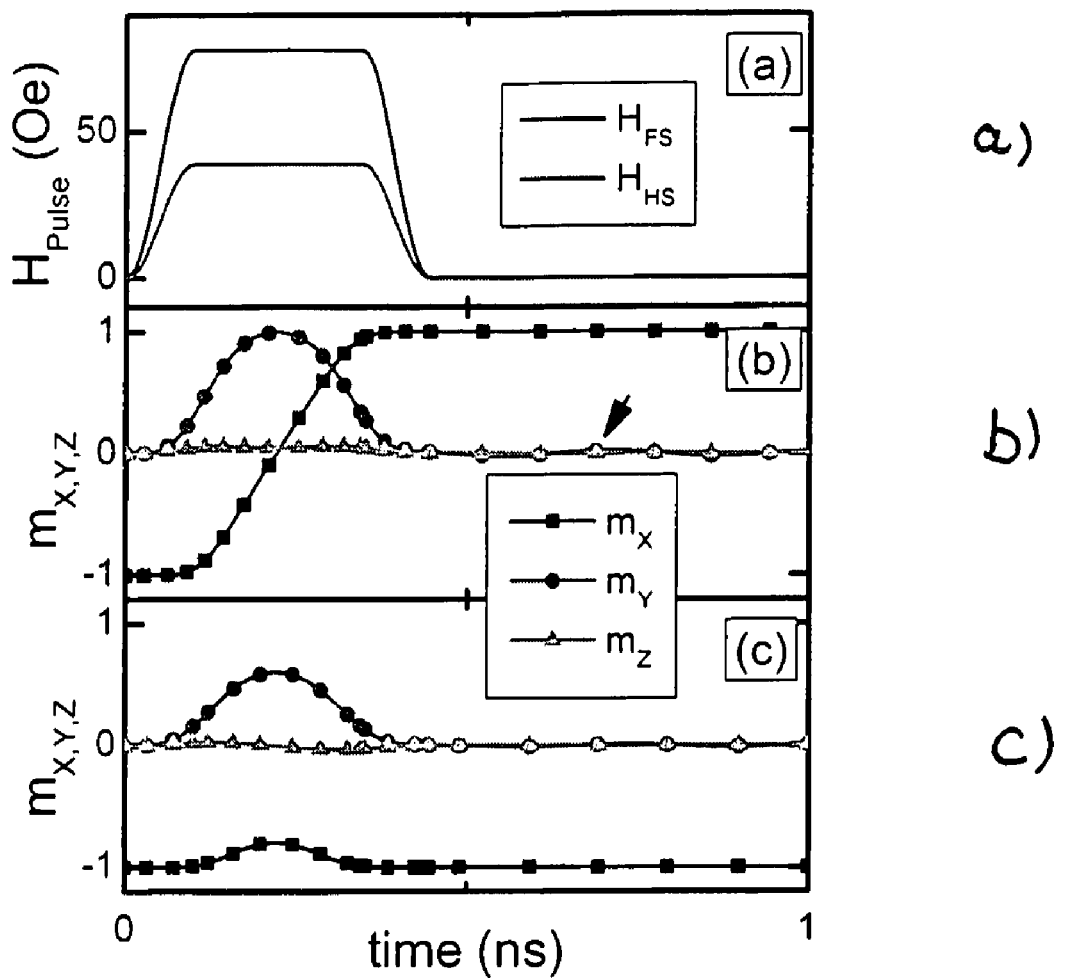
Figure 8:
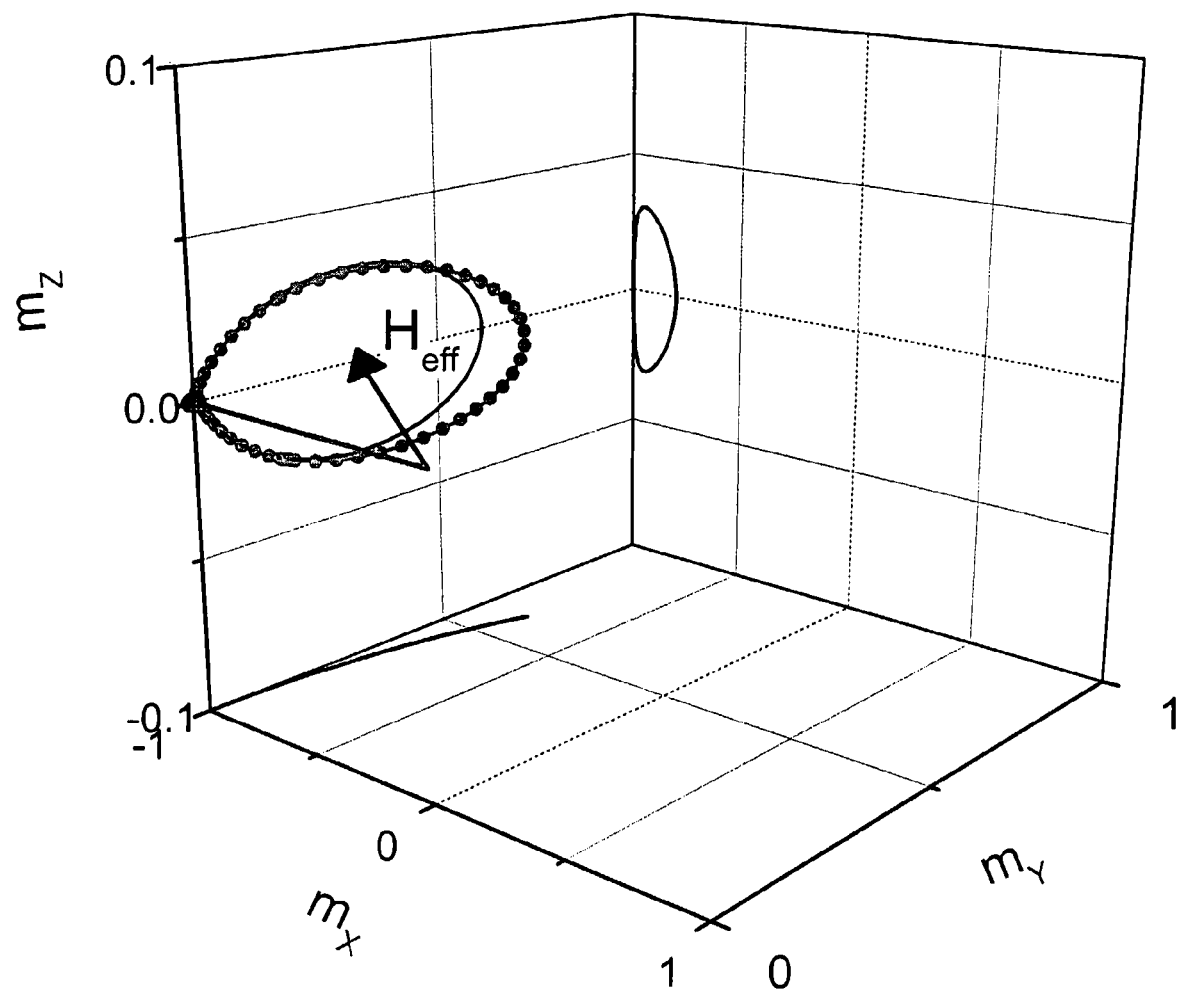
Figure 8:
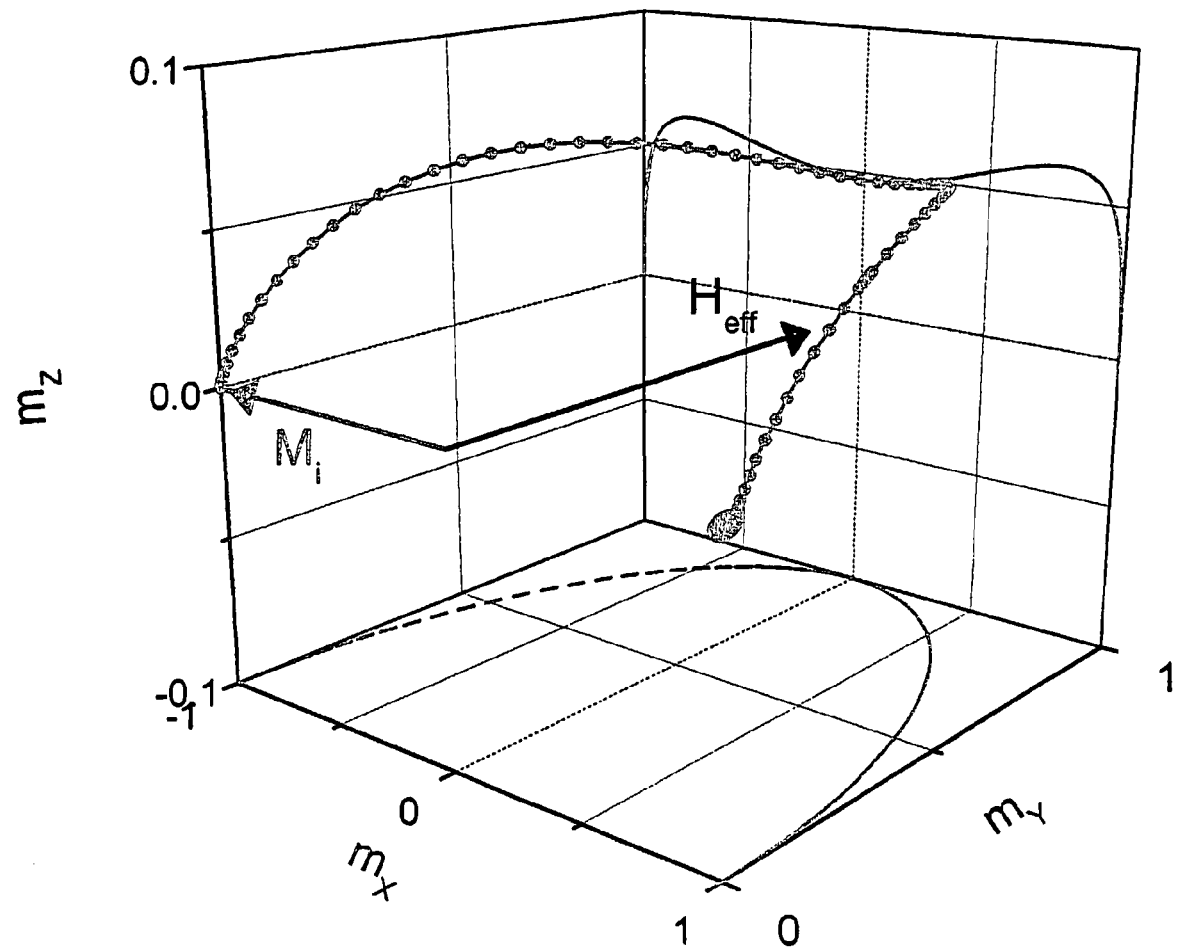
Figure 9:
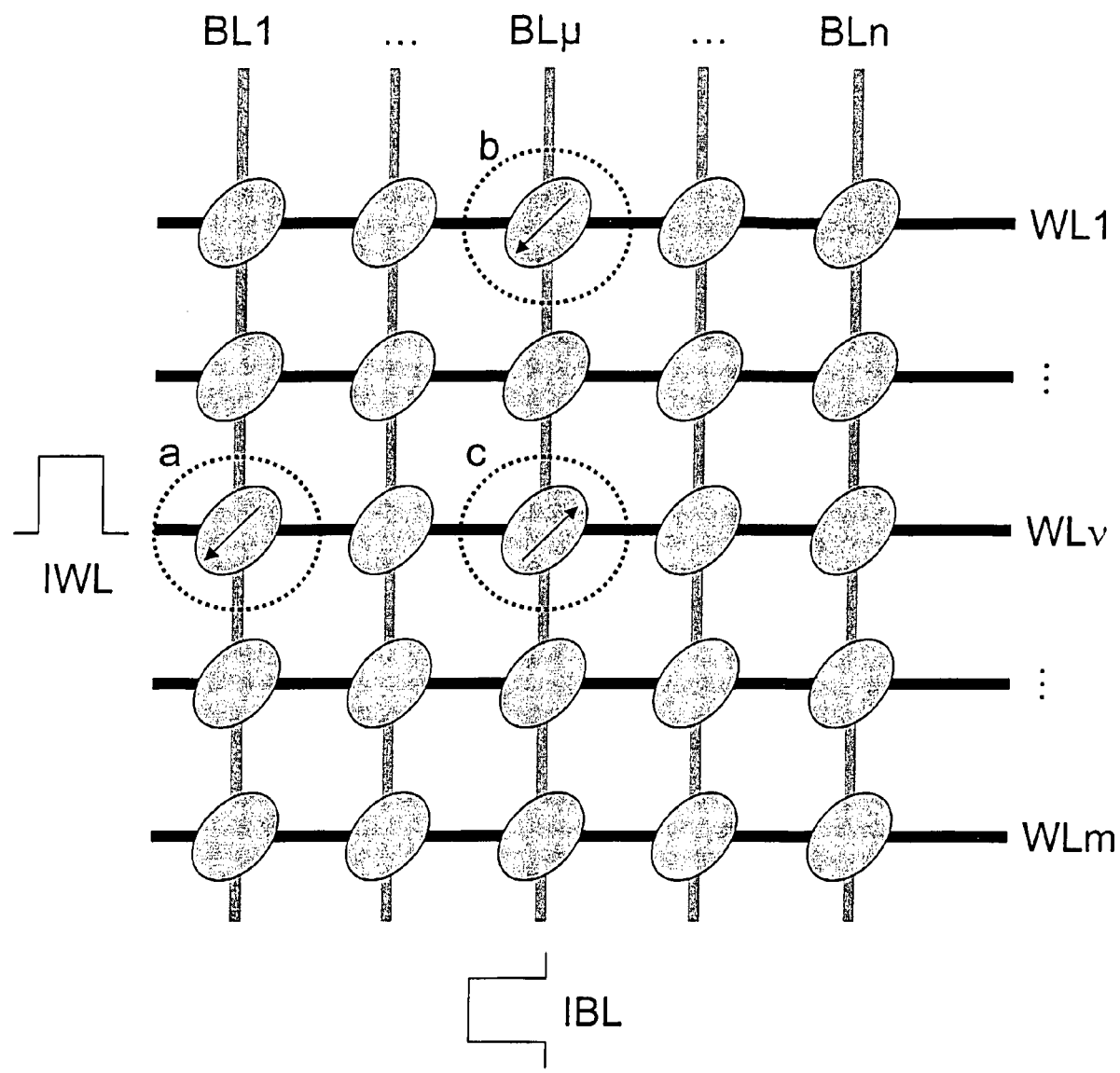
Figure 10:
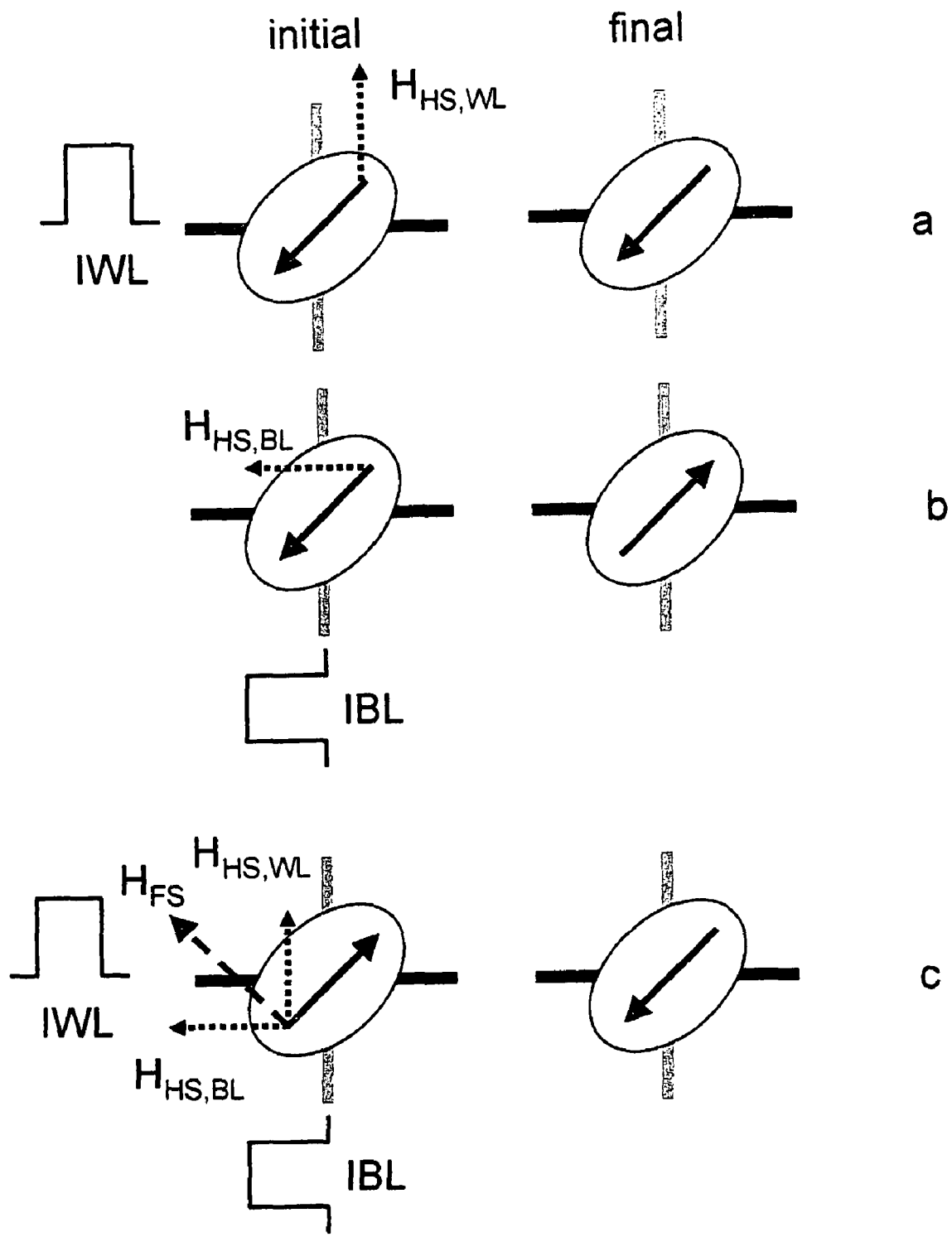
Figure 12:
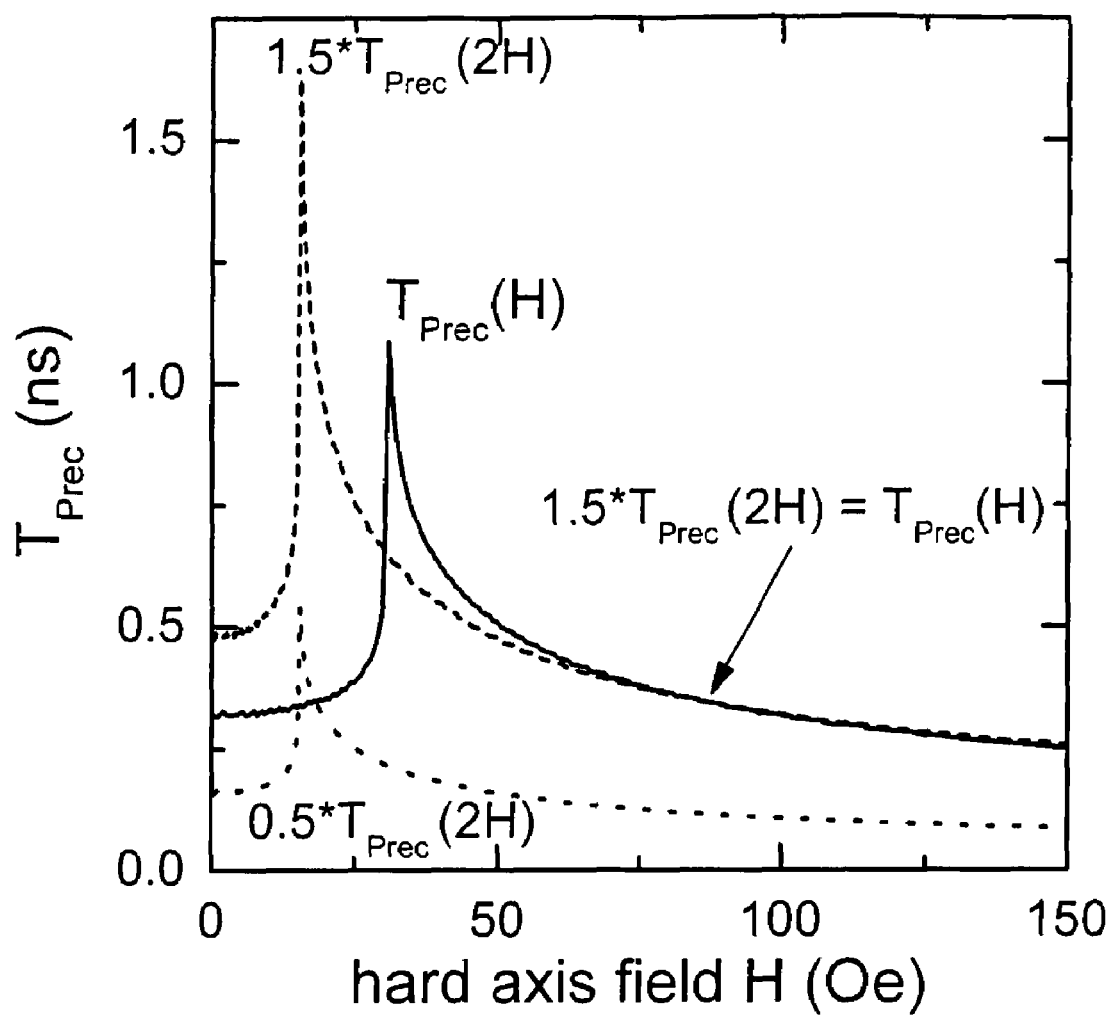
Figure 13:
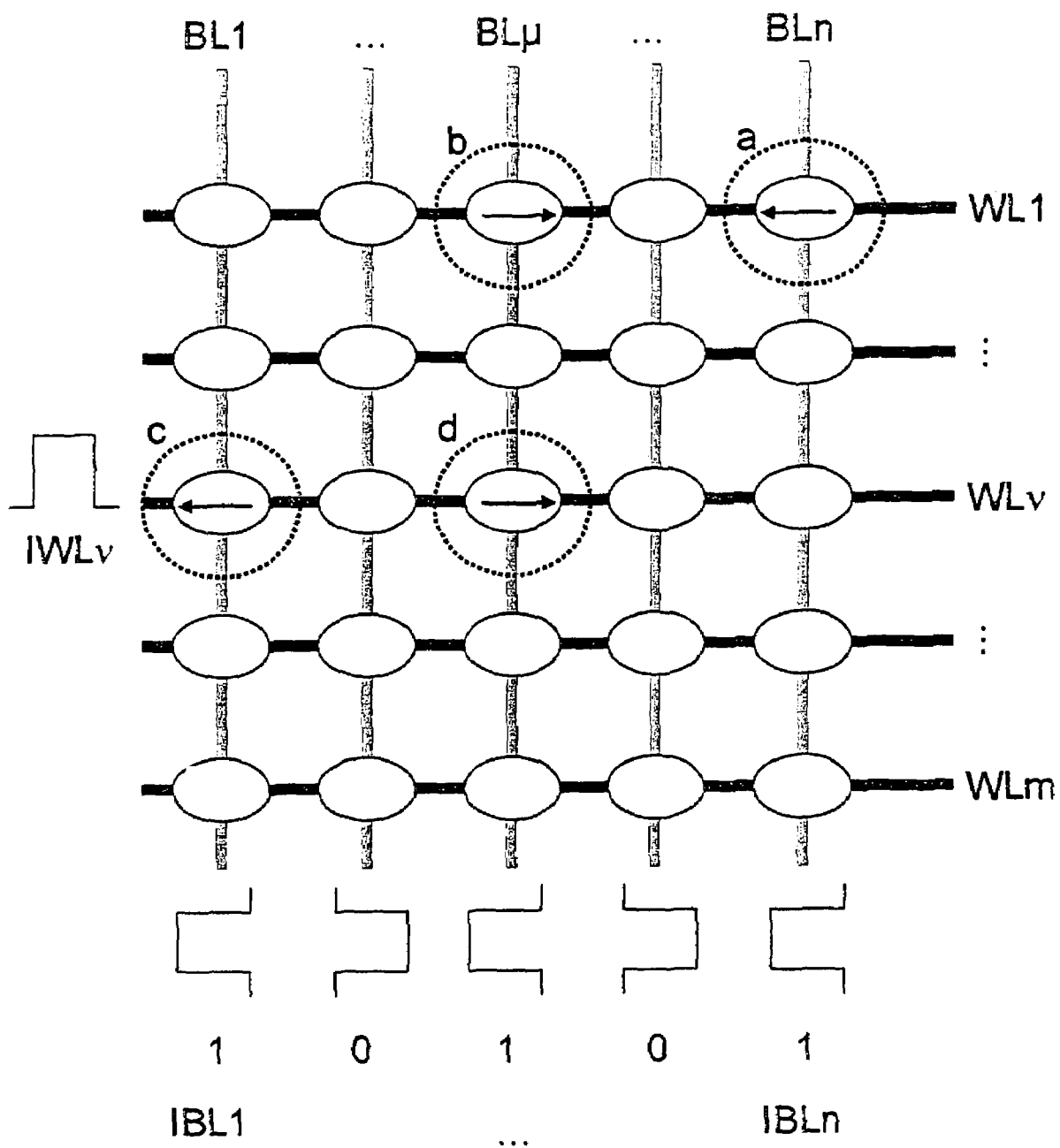
Figure 14:
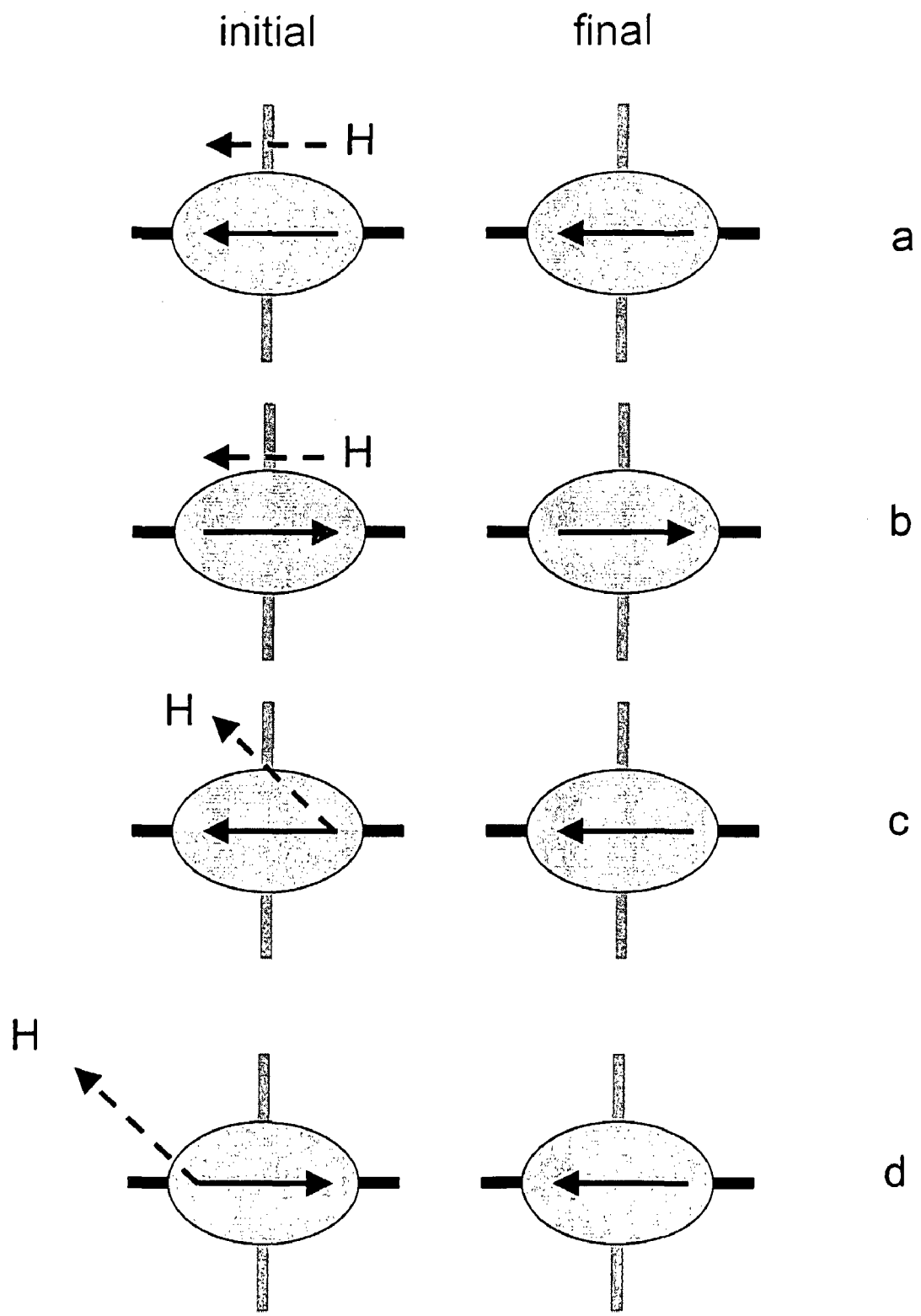
Figure 16:
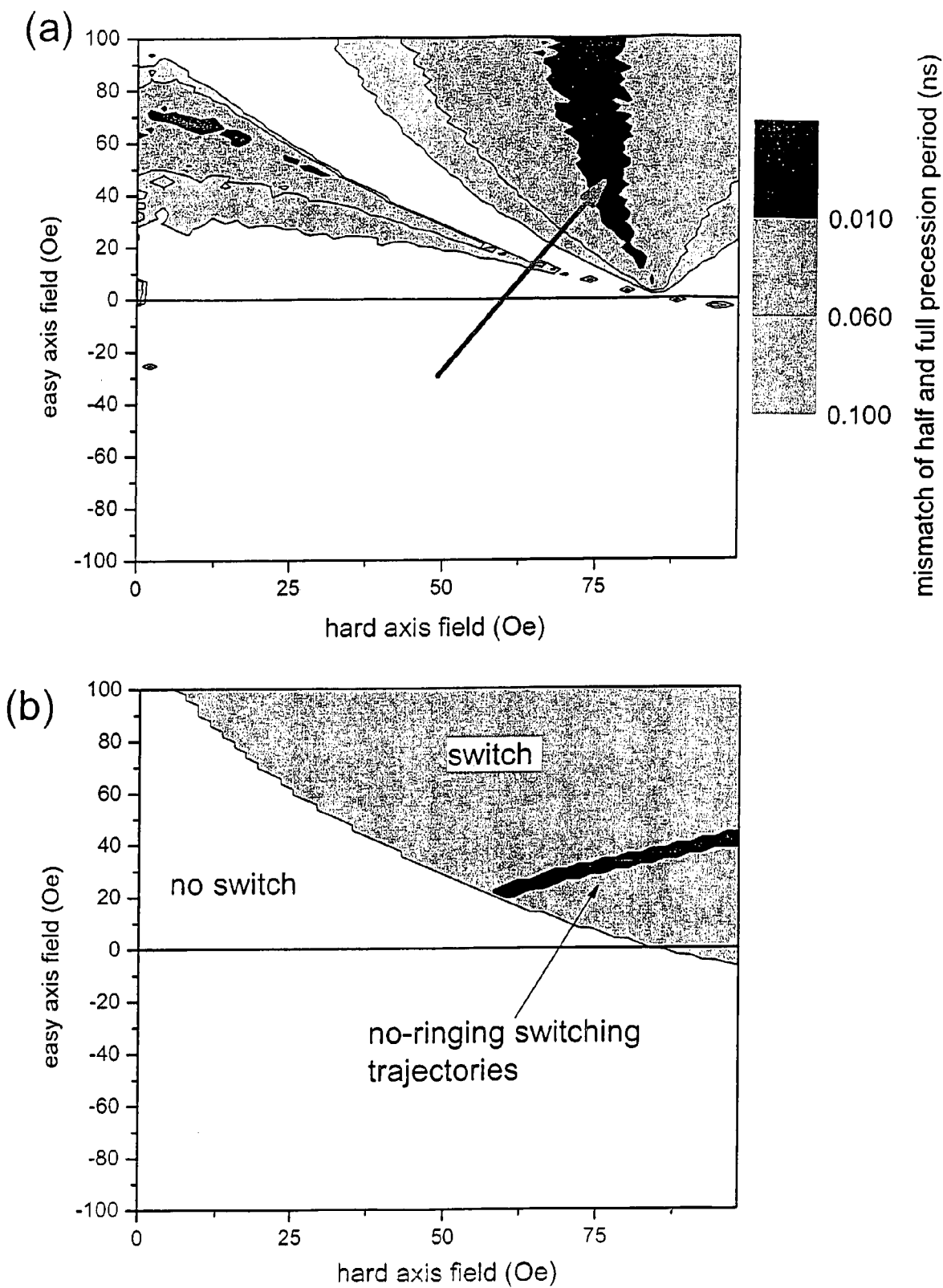
Figure 17:
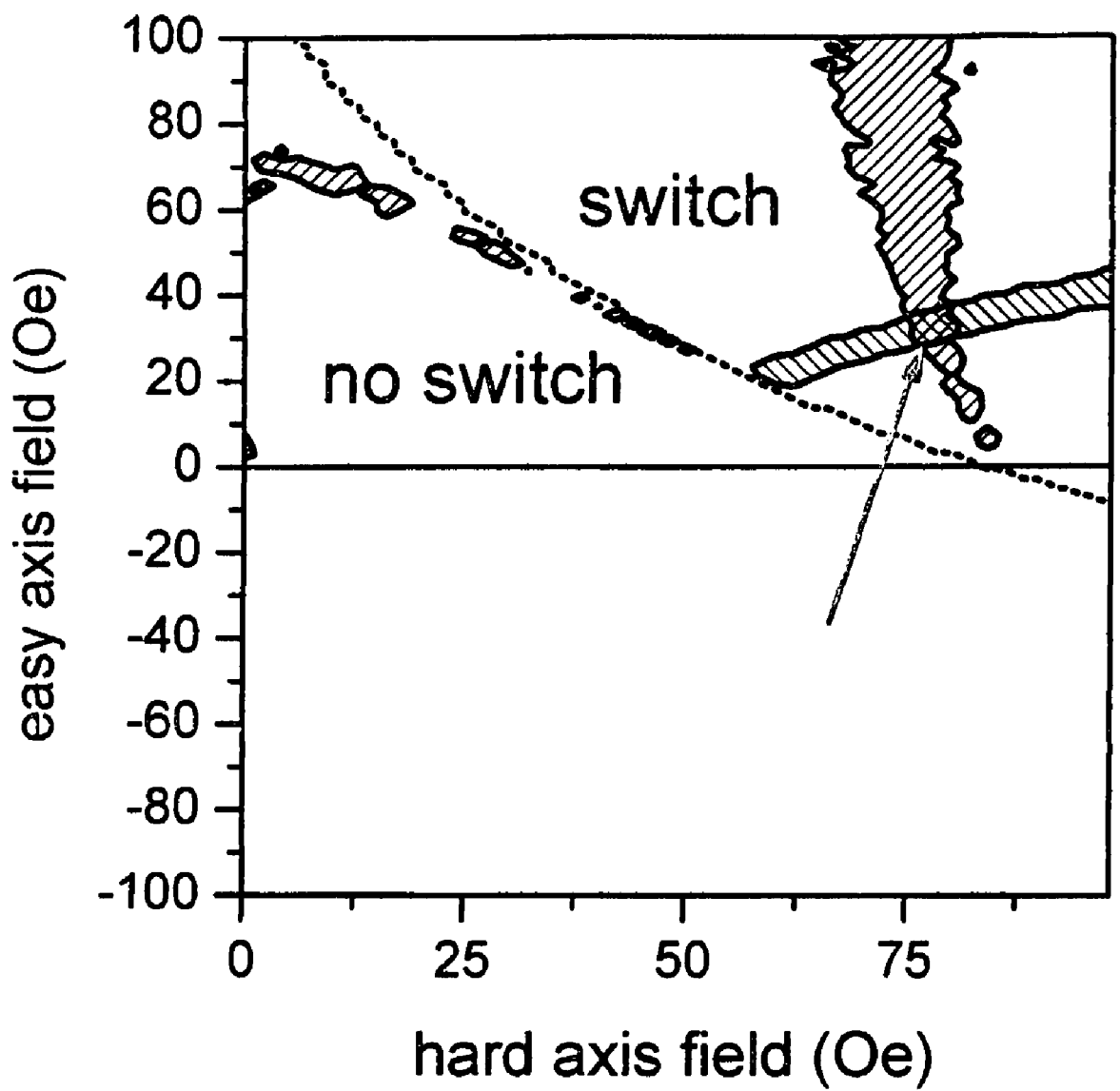
Figure 18:
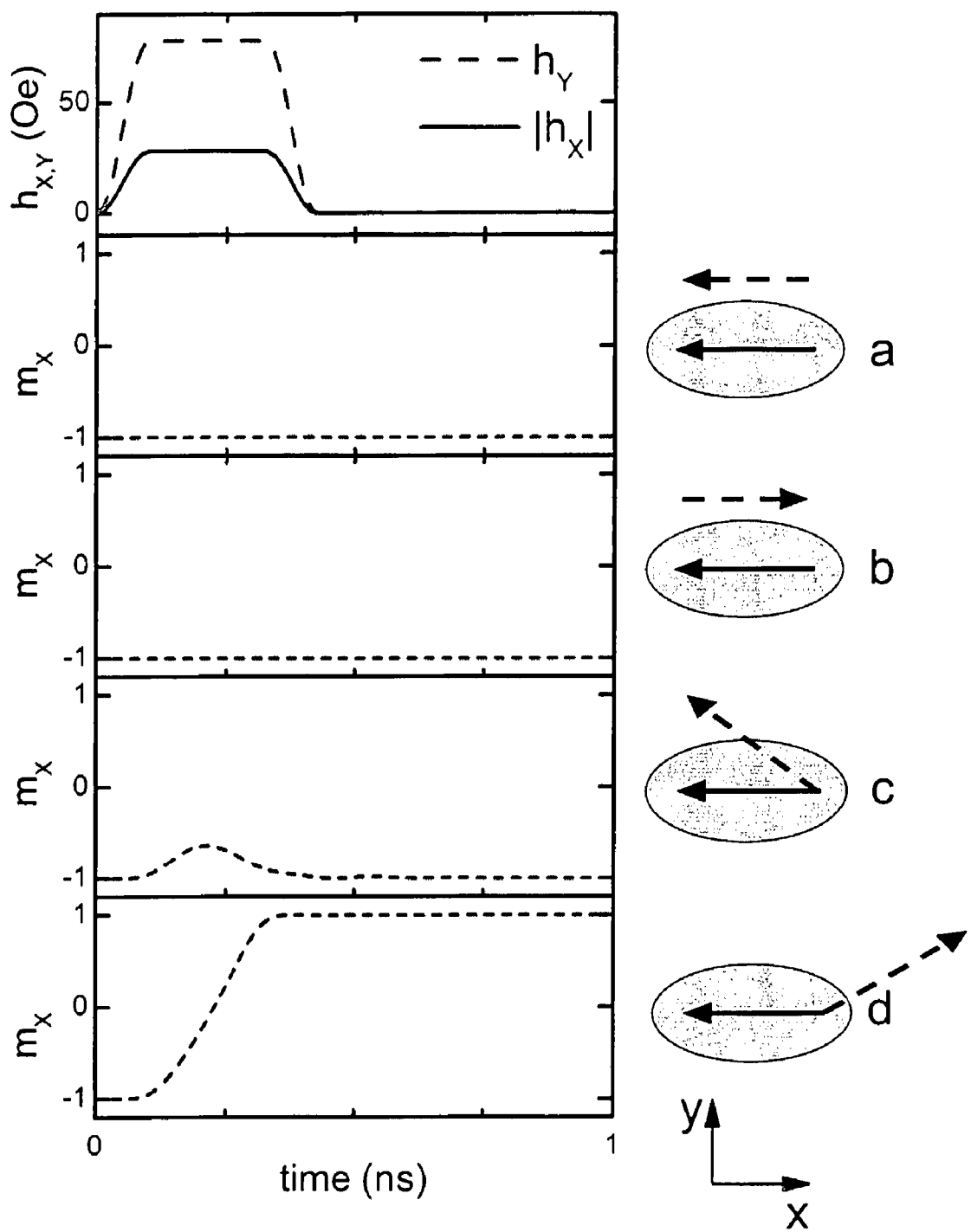

The invention will be described in the following in more detail by way of exemplary embodiments together with the enclosed drawings. It shows:

FIG. 1 sketches of the principle of storing digital information in a magnetic memory cell;

FIG. 2 a sketch of an MRAM cell array according to the first embodiment of the present invention;

FIG. 3 a sketch of an alternative arrangement of an MRAM cell array according to the first embodiment of the present invention;

FIG. 4a-c sketches of the applied fields at the half selected and full selected cells according to the first embodiment of the present invention;

FIG. 5a a plot of the precession periods as a function of the applied hard axis field according to the first embodiment of the present invention;

FIG. 5b,c plots of the precessional response of the magnetization to hard axis field steps according to the first embodiment of the present invention;

FIG. 6a-c plots of the half select and full select field pulses and magnetization trajectories for a first set of pulse and sample parameters according to the first embodiment of the present invention;

FIG. 7a-c plots of the half select and full select field pulses and magnetization trajectories for a second set of pulse and sample parameters according to the first embodiment of the present invention;

FIG. 8a a 3D plot of the half selection magnetization trajectories for the pulse and sample parameters of FIG. 7c according to the first embodiment of the present invention;

FIG. 8b a 3D plot of the full selection magnetization trajectories for the pulse and sample parameters of FIG. 7b according to the first embodiment of the present invention;

FIG. 9 sketches of the principle of a precessional write process in an MRAM cell array according to the prior art;

FIG. 10a-c sketches of the applied fields for the case of half selected and full selected cells of a precessional write process in an MRAM cell array according to the prior art;

FIG. 11a an example of the applied fields and the magnetization trajectories for the case of the half selected cell a of FIG. 9, 10;

FIG. 11b an example of the applied fields and the magnetization trajectories for the case of the half selected cell b of FIG. 9, 10;

FIG. 11c an example of the applied fields and the magnetization trajectories for the case of the fully selected cell c of FIG. 9, 10;

FIG. 12 a plot of the precession periods as a function of the applied hard axis field according to a modification of the first embodiment of the present invention;

FIG. 13 sketches of the write process to a set of MRAM cells according to the second embodiment of the present invention;

FIG. 14 sketches of the applied fields at the various cells during a write process according to the second embodiment of the present invention;

FIG. 15a a grey scale plot of the duration of a full precession period as a function of the applied fields according to the second embodiment of the present invention;

FIG. 15b a grey scale plot of the duration of a a half precession period of the magnetization as a function of the applied fields according to the second embodiment of the present invention;

FIG. 16a a grey scale plot of the duration mismatch of a half and a full precessional period during a write process according to the second embodiment of the present invention;

FIG. 16b shows the field limit of switching and non-switching of a memory cell and the field pulse region allowing no-ringing trajectories for precessional switching according to the second embodiment of the present invention;

FIG. 17 an overlay of the region of minimum duration mismatch of a half and a full precessional period of FIG. 13a and of the no-ringing switching trajectories of FIG. 13b according to the second embodiment of the present invention;

FIG. 18 an example of the applied pulse fields and trajectories of the easy axis magnetization component $m_x$ for the four cases occurring in the method of magnetization reversal according to the second embodiment of the present invention.

In FIG. 1 the two possible equilibrium orientations of the magnetization M along the easy axis of magnetization of the magnetic cell are sketched by the arrows. These two orientations of the magnetization M represent the two digital bit states "0" and "1" thus allowing to store digital information.

FIRST EMBODIMENT

FIGS. 2 and 3 show MRAM arrays according to the first embodiment of the pre-sent invention. In the magnetic memory cell array the magnetic memory cells are arranged in rows and columns. For programming the bit state of the cells the array further comprises a set of conducting word lines WL and bit lines BL running row wise and column wise, respectively. In the figure only an array of 3×3 memory cells is shown for clarity reasons. Of course the number of cells in an actual array can be chosen much larger without departing from the scope of the invention.

The cells comprise at least one magnetic free layer FL comprising of a first ferromagnetic layer having a magnetic anisotropy $H_K$ wherein the magnetic anisotropy can comprise various contributions e.g. due to uniaxial anisotropy, four-fold anisotropy, surface and interface anisotropies, magnetocrystalline anisotropies, and shape anisotropy, among others. The first ferromagnetic layer of the magnetic free layer FL further comprises an easy axis of magnetization and a distribution of the magnetization M. In equilibrium conditions the magnetization M is mainly oriented along one of the two easy axis directions. The two possible orientations of the average of the distribution of the magnetization M along the easy axis correspond to the two digital states of the cell.

The read out of the cells can be performed using e.g. magneto-resistive read out making use of magneto resistive effects like the GMR or TMR as known in the art. Accordingly the magnetic cell layer stacks can further comprise a magnetic pinned layer PL, a coupling layer between the free layer FL and the pinned layer PL, and other layers as known in the art of GMR and TMR stacks used for MRAM applications. The cells can further be in electrical contact to further metallization lines for reading out the magnetoresistance and thus the digital state of the cells.

Optionally the free layer FL can comprise a second ferromagnetic layer. The average magnetization of the additional ferromagnetic layer of the free layer FL in equilibrium conditions may be oriented antiparallel to the orientation of the average magnetization M of the first ferromagnetic layer. This antiparallel orientation or antiferromagnetic behaviour can be achieved by addition of a further non-magnetic coupling layer (e.g. made of copper, ruthenium or any other suitable material) between the two ferromagnetic layers of the free layer. Such coupling layers for antiferromagnetic coupling of the two free layers are known in the art. The antiferromagnetic orientation of the two free layers has the advantage of reducing the stray field of the free layer of the magnetic cell and thus of reducing the coupling between neighbouring cells.

In the cell array according to the first embodiment of the present invention each cell of the array of cells is situated at the meeting point of a word line WL and a bit line BL. In the vicinity of the cell the word line WL and bit line BL have a parallel segment. The parallel segment of the word and bit line is also oriented parallel to the easy axis of magnetization of the cell. This parallel alignment can be achieved like shown in FIG. 2 by tilting the cell's easy axis of magnetization and the word and bit lines by 45° with respect to the rows and columns of the array. Another way to achieve the parallel alignment of the cell's easy axis with the word and bit line is shown in FIG. 3. Other arrangements of the layout to achieve the parallel alignment of the conductive lines are possible and can be chosen by the person skilled in the art. The writing of a selected bit is performed by applying a current pulse IBL through the bit line BL and at the same time a current pulse IWL through the word line WL. The current pulses IBL, creates a magnetic field pulse at the cells which are situated at the corresponding bit line row of the array. The current pulses IWL, creates a magnetic field pulse at the cells which are situated at the corresponding word line column of the array.

In the following, the application of current pulses IBL,IWL through the word line WLν and the bit line BLµ is considered. The cells situated in the row of the word line WLν (like the cell a) are subject to the magnetic half select field $H_{HS,WL}$. The cells situated in the column of the bit line BLµ (like the cell b) are subject to the magnetic half select field pulse $H_{HS,BL}$ generated by the bit line BLµ. Only the cell c which is situated at the intersection of the word line WLν and the bit line BLµ is subject to the full select field $H_{FS}$ which is the superposed field of the two half select field pulses of the word and bit line $H_{FS}=H_{HS,BL}+H_{HS,WL}$.

Figure 4:
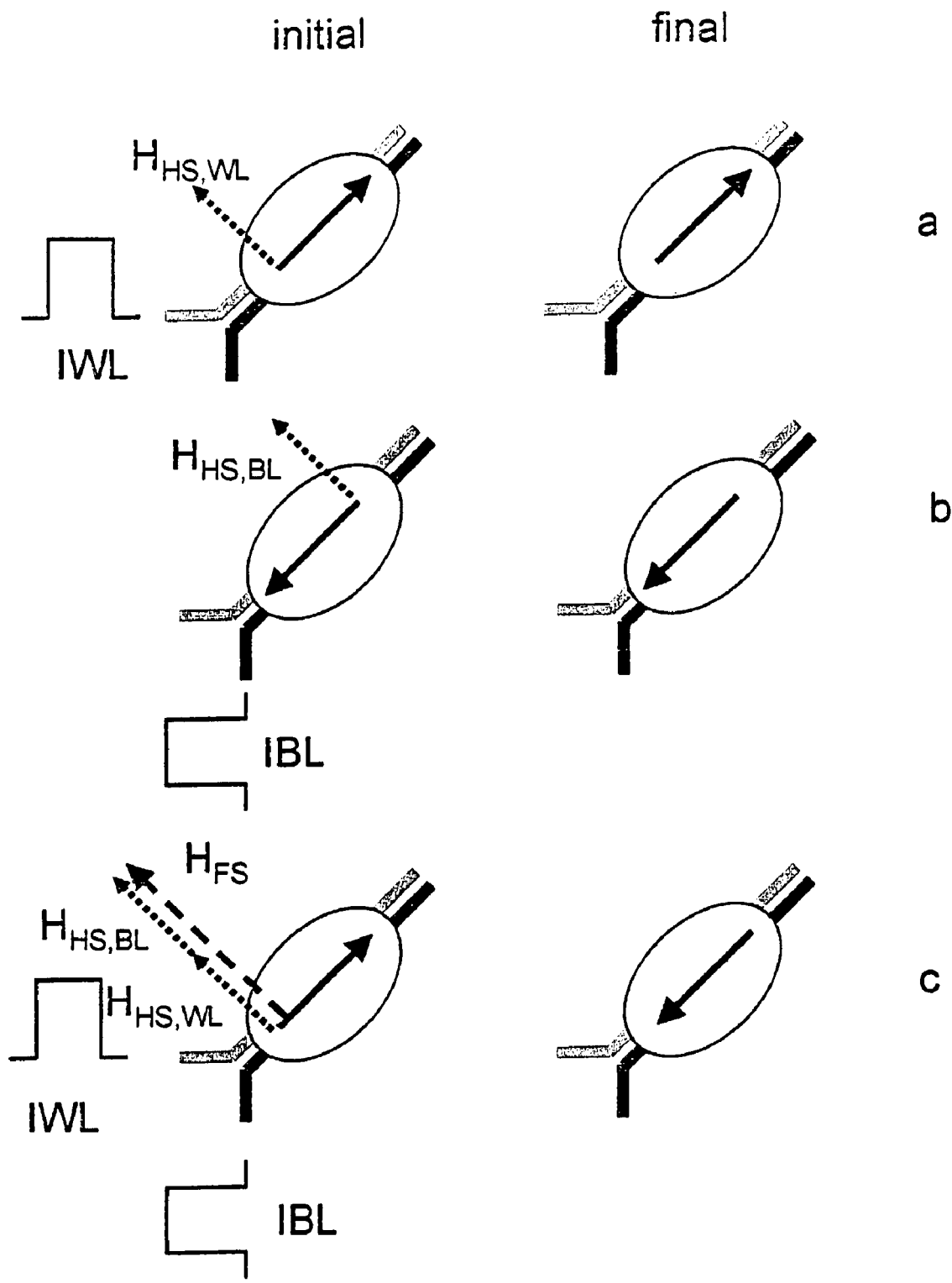

The applied fields in the three cases of half selection by the bit line pulse (a), half selection by the word line pulse (b) and in the case of full selection by the combined pulses of word and bit line (c) are sketched in more detail in FIG. 4. As the bit and word lines run parallel along the easy axis of magnetization the half and full select fields $H_{HS,BL}$, $H_{HS,WL}$, and $H_{FS}$, respectively are all oriented perpendicular to the initial free layer magnetization M. In the figures the magnetization M is again indicated by the solid arrow in the cell.

The optimum performance for bit addressing of the magnetic memory cell array according to this embodiment of the present invention is obtained when the ringing of the magnetization is suppressed or at least strongly reduced both after the half select field pulses $H_{HS,BL}$, $H_{HS,WL}$ and after the full select field pulse $H_{FS}$. This can be achieved if during the application of the half select field pulses $H_{HS,BL}$ $H_{HS,WL}$ the magnetization M performs a full precessional turn about the effective field $H_{eff}$. The effective field $H_{eff}$ is thereby the sum of the applied pulse fields generated by the bit/word line and of the internal fields $H_{int}$. Hereby the amplitude and orientation of the internal fields depends on the orientation of the magnetization M and is due to the various magnetic anisotropies $H_K$ of the free layer of the magnetic cell. After a full precessional turn the magnetization M is again oriented very near the initial easy axis of the magnetization. The magnetization M will thus not be reversed by the field pulse. Furthermore as the magnetization M is again aligned very near the initial easy axis the magnetization M is near the equilibrium and only very little if any relaxation is needed to reach the final equilibrium. Consequently, the ringing of the magnetization M after the decay of the half select pulse will be practically suppressed or at least strongly reduced.

For the case of the fully selected cell c however a different behaviour is necessary. During application of the full select pulse $H_{FS}$ the magnetization M should perform a half precessional turn and the magnetization M should be reversed upon decay of the full select field pulse $H_{FS}$. If the magnetization M performs a half precessional turn about the effective field $H_{eff}$ the magnetization will be oriented very near the final reversed easy axis and again very little relaxation is necessary to reach the final reversed equilibrium conditions. Consequently, also for the cell selected for switching the ringing upon decay of the full select pulse will be practically suppressed or at least strongly reduced.

To obtain this optimal situation of a full precessional turn of the magnetization which does not reverse the magnetization during the application of the half select field pulses $H_{HS,WL/BL}$ and a half precessional turn which reverses the magnetization during the application of the full select field pulses $H_{FS}$ the parameters of the half and full select pulses have to be adapted to the specific properties of the free layer FL of the magnetic cell.

The properties of the field pulses which can be varied are e.g. the amplitudes of the pulses $H_{HS,BL}$, $H_{HS,WL}$, $H_{FS}$, the orientation of the field pulses with respect to the easy axis of the cells (which are linked to the orientation of the word and bit lines to the easy axis of the cells), the pulse durations $T_{Pulse}$ of the half and full select pulses, the rise and fall times of the half and full select pulses $T_{rise}$, $T_{fall}$, the shape of the half and full select field pulses, the delay time between the application of the two half select pulses, and others.

The properties of the free layer FL which can be varied are the saturation magnetization $M_S$ (which is depends on the magnetic material of the free layer), the thickness of the free layer FL and the shape of the magnetic cell which changes the shape anisotropy of the free layer, the further material dependent anisotropies of the magnetic free layer like the uniaxial anisotropy, four-fold anisotropy, magnetocrystalline anisotropy, surface and interface anisotropies and so forth. Of further importance are the number and material properties of the further magnetic and non-magnetic layers of the free layer, the magnetic coupling of the free layer FL to the pinned layer PL and to the other layers of the cell stack, and others.

In the following an example will be shown of an optimization of the pulse parameters for a certain set of cell parameters and field geometries. As seen in FIG. 2 to 4 the half select pulses of the word and bit lines are oriented perpendicular to the initial and final easy axis of magnetization M of the cells of the array. The behaviour of the magnetization M to the application of the field pulse is thus symmetric for the two initial orientations of the magnetization M along the easy axis of magnetization. In other words a half select field pulse $H_{HS}$ that induces a full precessional turn of the magnetization M about the effective field for one initial orientation of M will also induce a full precessional turn of the magnetization M about the effective field for the other initial orientation of the magnetization M and vice versa. Furthermore, as the fields of the bit and word lines are both oriented perpendicular to the easy axis of the cells also the role of the field pulses created by the word and bit lines can be exchanged. A half select magnetic field pulse $H_{HS,WL}$ created by the word line WL which is suitable to induce a full precessional turn of the magnetization M is also suitable as a half select magnetic field pulse $H_{HS,BL}$ created by the bit line BL and will also lead to a full precessional turn of the magnetization of the cell. Therefore in this geometry the same pulse parameters can be chosen for the two half select field pulses. The half select pulses can thus have the same amplitude $H_{HS,BL}=H_{HS,WL}=H_{HS}$ and the same pulse duration $T_{HS,BL}=T_{HS,WL}=T_{HS}$. The full select pulse at the cell c is the superposition of the two half select field pulses. If no time delay between the application of the two half select pulses is present it therefore follows that the amplitude of the full select field pulse is twice the amplitude of the half select field pulse $H_{FS}=2H_{HS}$ and the duration of the half select field pulse and the full select field pulse is the same $T_{HS}=T_{FS}=T_{pulse}$.

As mentioned above the half select field pulse $H_{HS}$ should induce approximately a full precessional turn of the magnetization M. In other words the pulse duration $T_{HS}$ of the half select pulse should approximately match the duration of a full precessional turn $T_{prec}$ during application of the half select field $H_{HS}$. The duration of the full precessional turn is also called the precession period and depends on the applied field $T_{prec}=T_{Prec}(H)$. The no-ringing criterion for the half select field pulses $H_{HS}$ is thus that the pulse duration of the half select field pulse $T_{HS}=T_{Pulse}$ approximately equals the precession period under application of the half select field:

$$T_{pulse}=T_{Prec}(H_{HS}).\quad\text{(Equation 2)}$$

A further no ringing criterion can be derived for the full select field pulse $H_{FS}$. Here the full select field pulse $H_{FS}=2H_{HS}$ should induce a half precessional turn. In other words the pulse duration of the full select pulse $T_{FS}=T_{Pulse}$ should equal the half of the precessional period $\tfrac{1}{2}\cdot T_{Prec}(H_{FS})$ under application of the full select field pulse: $T_{pulse}=\tfrac{1}{2}\cdot T_{Prec}(H_{FS})$ and thus $$T_{pulse}=\tfrac{1}{2}T_{Prec}(2\cdot H_{HS}).\quad\text{(Equation 3)}$$

To optimize the bit addressing in the cell array of this embodiment one has to find a field amplitude $H_{HS}$ which fulfils equation 2 and equation 3 for the precession period $T_{Prec}(H)$ at the same time. When the correct half select field amplitude $H_{HS}$ is found the pulse duration $T_{pulse}$ is chosen accordingly:

$$T_{pulse}=T_{Prec}(H_{HS})=\tfrac{1}{2}\cdot T_{Prec}(2\cdot H_{HS}).\quad\text{(Equation 4)}$$

The precession periods $T_{Prec}(H)$ of the magnetic free layer FL can be e.g. derived numerically from single spin simulations. Other methods to derive the precession periods like micromagnetic simulations, measurements of the ferromagnetic resonance frequencies, or magnetic pulse response measurements are possible and known in the art. Here, the numerical solutions of the LLG equation (Equation 1) for a single spin is used, i.e. the free layer is modelled assuming a uniform distribution of the magnetization in the sample. The free layer FL of the magnetic cell is again modelled as a rotational ellipsoid of permalloy (NiFe) having a saturation magnetization of $4\pi M_S=10800$ Oe and demagnetizing factors of $N_x/4\pi=0.00615$ (easy axis), $N_y/4\pi=0.01746$ (in-plane hard axis), and $N_z/4\pi=0.9764$ (out of plane) corresponding to ellipsoid dimensions of 500 nm×200 nm×5 nm. In the calculations of the magnetic anisotropy of the free layer only the shape anisotropy resulting from the geometry given above is taken into account. In the calculations the easy axis is again along the x-axis, the intermediate axis (in plane hard axis) is along the y-axis, and hard axis (out of plane hard axis) is along the z-axis. Initially, i.e. before pulse application the magnetization M is oriented along the negative easy axis: $M=(m_x, m_y, m_z)=(-1, 0, 0)$. In the first step a vanishing damping $\alpha=0$ is assumed.

The precession period $T_{Prec}(H)$ is derived from the time dependent simulation of the magnetization response of the cell's free layer FL to a field step H along the in-plane hard axis $H=(0, H, 0)$. Here, a vanishing rise time of the field step is used in the calculations. The such derived precession periods $T_{prec}$ are plotted in FIG. 5*a* (upper panel).

As seen in FIG. 5*a* for low hard axis fields H the precession period $T_{prec}$ first weakly increases with H. Here, the shape anisotropy is dominating and the magnetization M mainly processes about the internal field $H_{int}$ due to the sample's anisotropy. Conversely, for high applied fields the applied field H is dominating, the magnetization M precesses basically about H, and $T_{prec}$ decreases with H. The two regions are separated by a peak. Note that on the low field side of the peak the magnetization M does not overcome the hard axis during step excitation and thus no magnetization reversal is possible. Also $\tfrac{1}{2}\cdot T_{Prec}(2\cdot H)$ is plotted in the figure. The two curves cross in two points where the criterion of equation 4 $T_{Prec}(H)=\tfrac{1}{2}\cdot T_{Prec}(2\cdot H)$ is fulfilled. However as the magnetization M has to overcome the hard axis during switching (which is not the case on the low field cross point) only the high field cross point (arrow) allows for bit addressing. The optimal bit addressing parameters for the given sample parameters are $T_{Pulse}=344$ ps, $H_{HS}=36.75$ Oe, and $H_{FS}=2\cdot H_{HS}=73.5$ Oe. The two corresponding step response trajectories of the magnetization $M=(m_X, m_Y, m_Z)$ vs. time for $H_{FS}$ and $H_{HS}$ are shown in FIG. 5b and FIG. 5c, respectively. As marked by the vertical arrow the duration of a half precession in FIG. 5b and the duration of a full precession in FIG. 5c are the same which allows optimal bit addressing.

Figure 6:
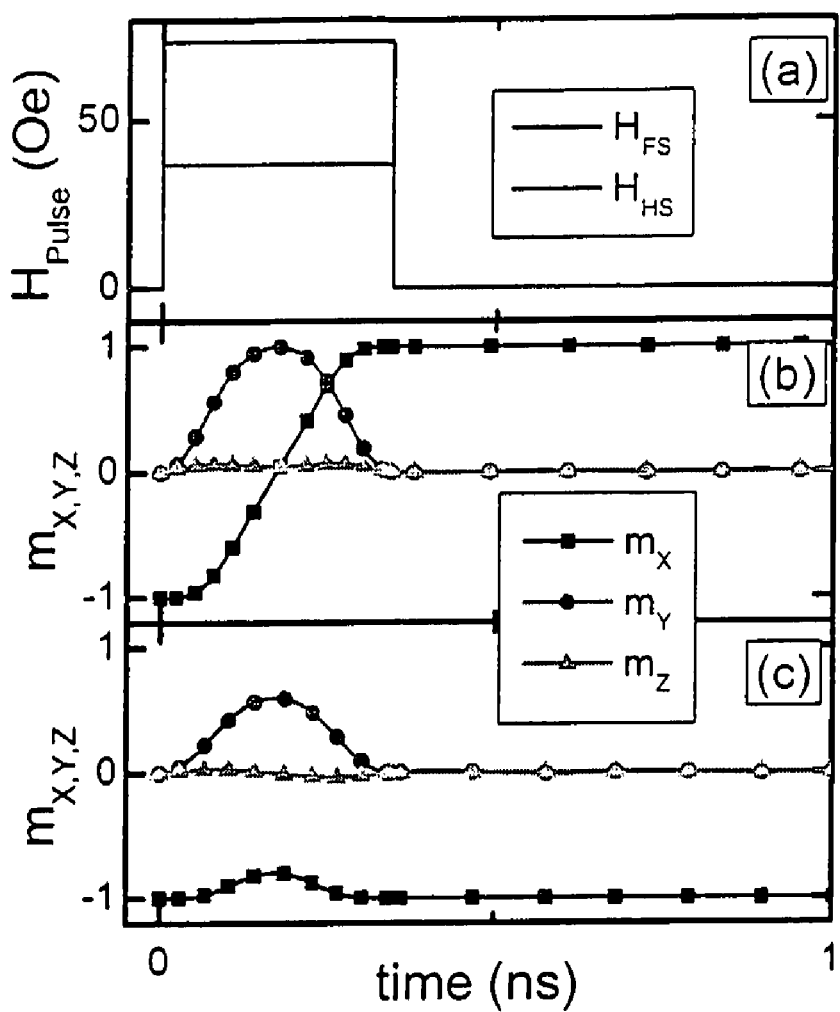

The trajectories of bit addressing by pulses having these optimal parameters are shown in FIG. 6. In FIG. 6a the two pulses for half-select and full-select addressing are shown. Again, vanishing damping and vanishing rise and fall times of the pulses are assumed. The pulse duration is $T_{Pulse}=344$ ps and the amplitudes are $H_{HS}=36.75$ and $H_{FS}=73.5$ Oe for half and full selection, respectively. FIG. 6b shows the response to the full-select pulse $H_{FS}$. One can see that the magnetization M performs exactly a half precessional turn about the pulse field during pulse application. After pulse decay the magnetization is reversed and no ringing is present. The response to the half-select pulse $H_{HS}$ is shown in FIG. 6c. Here, the magnetization M performs a full precessional turn without overcoming the magnetic hard axis. Also here, the magnetization M is in equilibrium upon pulse decay and a ringing free ballistic trajectory is observed. These pulse parameters would thus allow optimal ultra fast bit addressing and, as a consequence, ultimate MRAM write clock rates.

Up to now only a very ideal system ($\alpha=0$, vanishing rise and fall time) has been considered. FIG. 7 shows similar optimal bit addressing trajectories for more realistic parameters. Here, the rise and fall times of the pulses are 100 ps and the Gilbert damping is $\alpha=0.001$, a value which is feasible for high quality permalloy thin films. The demagnetizing factors and the saturation magnetization remain the same as given above. The two pulses are shown in FIG. 7a. The change of damping and the rise and fall times lead to a slight shift of the optimum parameters for ballistic bit addressing. The pulse amplitudes are now $H_{HS}=39$ Oe and $H_{FS}=2\cdot H_{HS}=78$ Oe. The pulse duration is $T_{Pulse}=345$ ps when measured at half maximum. The pulse starts to rise at 0 ps and fully decays to zero at a time of 395 ps. The switching trajectory of the magnetization M generated by the full select pulse is shown in FIG. 7b. Again the magnetization M performs a half precessional turn, overcomes the hard axis, and switches to the reversed easy direction. Due to $\alpha\neq0$ the magnetization M is not exactly in equilibrium upon pulse decay and a slight ringing remains (arrow). However, the maximum angle mismatch out of the equilibrium direction is less then 1.5° and can be neglected. A three dimensional plot of the same switching trajectory is found in FIG. 8b. The trajectory of the magnetization $M=(m_X, m_Y, m_Z)$ is displayed as the line marked by the dots. The full and dashed lines are projections of the trajectory in the $m_X/m_Z$-plane and the $m_X/m_Y$-plane, respectively. The magnetization precesses from the initial orientation of the magnetization $M_i$ to the final reversed orientation by performing a half precessional turn about the effective field $H_{eff}$. The non-circular shape of the switching trajectory is due to the strong shape anisotropy of the flat free layer FL.

Also for the non-switching trajectory shown in FIG. 7c the ringing is practically fully suppressed. Upon pulse termination the magnetization M has performed a full precessional turn and is not reversed. The angle mismatch of the magnetization M from the equilibrium easy axis direction is even smaller than in the switching case and is hardly observable in FIG. 7c. A three dimensional plot of the same non-switching trajectory is found in FIG. 8a. The trajectory of the magnetization $M=(m_X, m_Y, m_Z)$ is displayed as the line marked by the dots. The full lines are again the projections of the trajectory in the $m_X/m_Z$, the $m_Y/m_Z$, and the $m_X/m_Y$-plane, respectively. The magnetization precession starts from the initial orientation $M_i=(-1, 0, 0)$ and returns to it by performing a full precessional turn about the effective field $H_{eff}$. The non-circular shape of the trajectory is again due to the strong shape anisotropy of the flat free layer FL.

Figure 11:
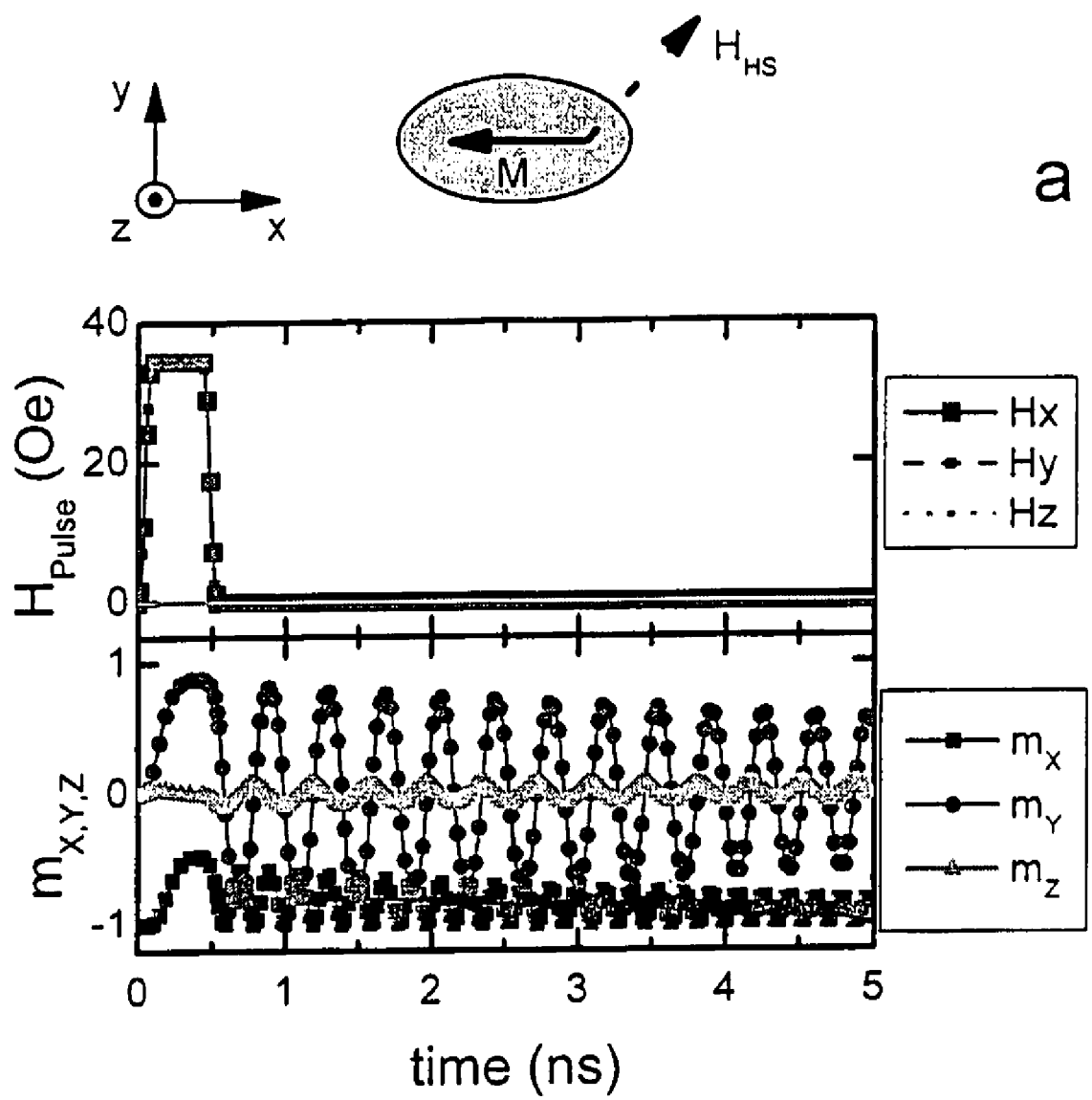
Figure 11:
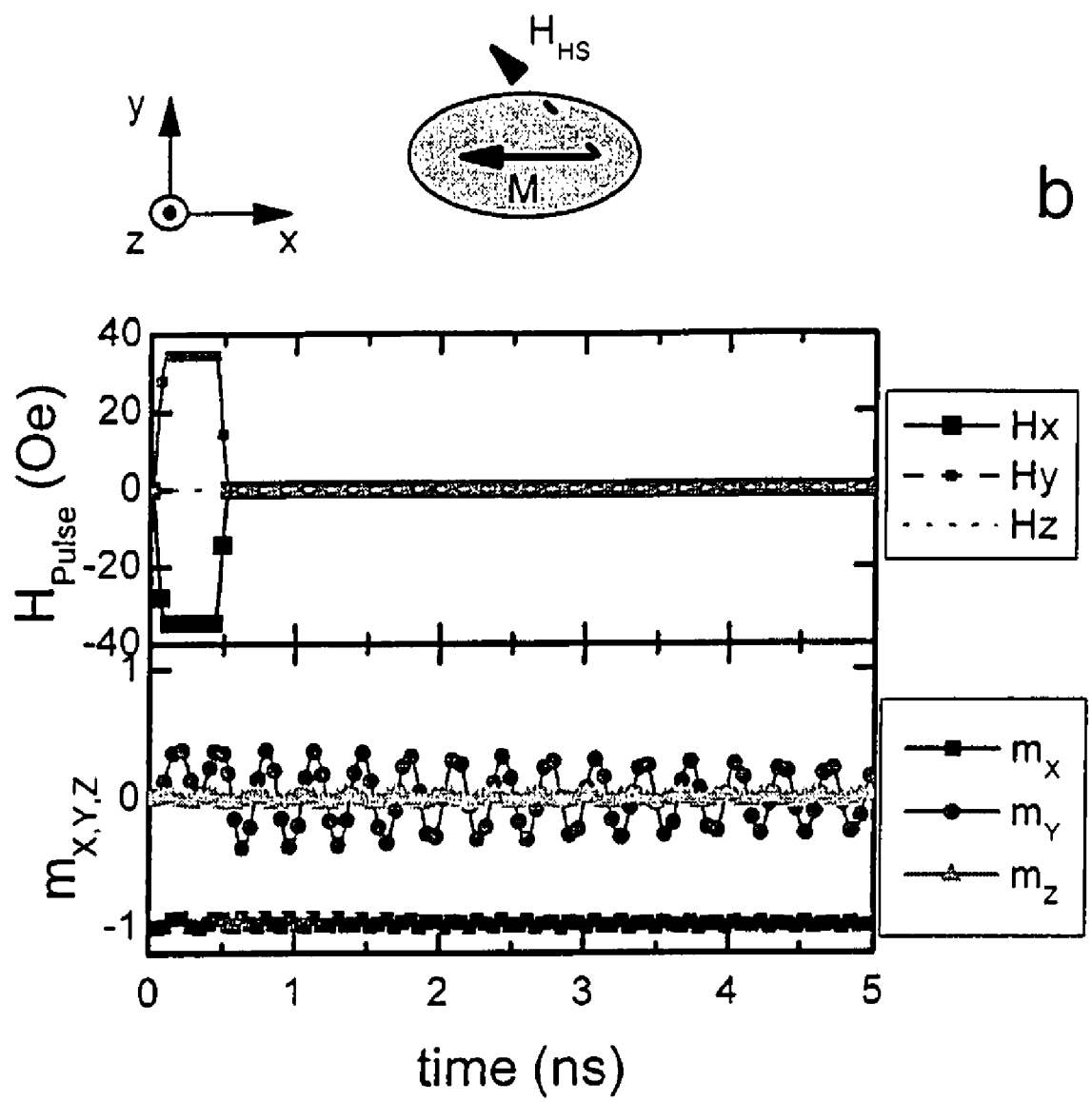
Figure 11:
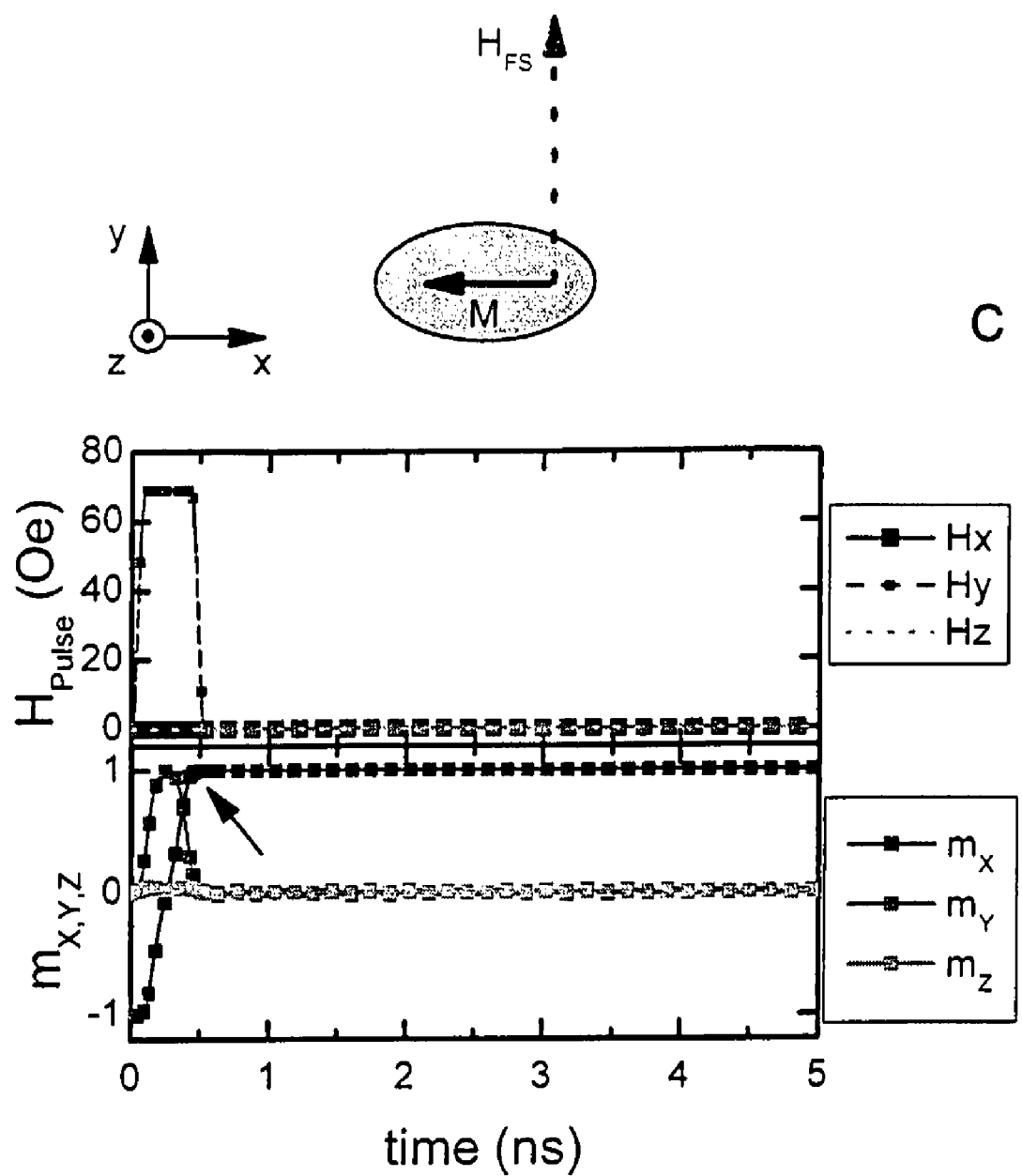

To underline the advantage of the present invention the full and half select trajectories of the magnetization M in a conventional array layout are presented in FIGS. 9 to 11. A switching trajectory for such ballistic switching of the full selected cell c of FIGS. 9 and 10 is plotted in FIG. 11c. FIGS. 11a and 11b show the trajectories of the magnetization M of the free layer FL of the half-selected cells a, b in a conventional array layout according to the prior art during the application of the half select field pulses. The field geometries of the two cases correspond to the half selected cells a and b of FIGS. 9 and 10. The pulse parameters field amplitudes, durations and rise and fall times are $H_{HS}=48.8$ Oe, $T_{Pulse}=435$ ps, $T_{Rise}=T_{Fall}=100$ ps. The parameters of the magnetic cells are the same as given above.

In FIG. 11a the trajectories and pulse parameters for the situation of the cell a of FIGS. 9 and 10 is displayed. Here, the half select pulse field $H_{HS}$ is applied in a 135° angle with respect to the initial orientation of the magnetization M as seen in the sketch on top. The components of the field pulse point along the x and y direction with amplitudes of $H_X=H_Y=34.5$ Oe as shown in the upper panel. The magnetization response to this half-select pulse is shown in the lower panel. As necessary for correct half selection the magnetization is not reversed by the pulse and $m_X<0$. However, upon pulse decay the magnetization is very far from equilibrium and a strong precessional relaxation of the magnetization is observed. Owing to the low Gilbert damping factor $\alpha=0.001$ the precessional oscillations (also called magnetic ringing) persists much longer than the 5 ns time window.

The same effect can be observed for the cell b of FIGS. 9 and 10. Here the half select pulse field of the same amplitude as given above is applied in a 45° angle with respect to the initial orientation of the magnetization M as shown in the sketch on top. The components of $H_{HS}$ point along the −x and −y direction with $|H_X|=H_Y=34.5$ Oe. Also in this case the magnetization is not reversed by the half select pulse. But also here, a strong ringing of the magnetization upon the decay of the field pulse is found which again persists for more than 5 ns. Here the ringing was exemplified by calculations with an effective Gilbert damping parameter of $\alpha=0.001$. However, also for considerably higher damping parameters of e.g. $\alpha=0.03$ such ringing was found to persist for several nanoseconds.

It should be noted, that in the example of the first embodiment shown in FIG. 7 the Gilbert damping parameter $\alpha=0.001$ and all other cell parameters are the same as in the prior art example shown in FIG. 11. It is obvious that the method of bit addressing disclosed in the present embodiment provides a great improvement over the bit addressing methods of the prior art as the ringing of the magnetization after the application of the full select and of the half select bit addressing pulses is practically fully suppressed.

These calculations of the first embodiment show that it is possible to obtain optimal bit addressing in a magnetic memory cell array with ringing free trajectories both for half-select and full-select pulses. In the geometry discussed here the switching is obtained by transverse pulses along the in-plane hard axis only. The corresponding memory is thus operated in the "toggle write" mode and the magnetization M is switched back and forth with every full-select pulse application. For the set of parameters used in the simulation the bit addressing is completely terminated within less than 400 ps corresponding to a maximum MRAM clock rate of 2.5 GHz. The numerical values (pulse duration, pulse amplitudes, etc . . . ) depend strongly on the magnetic device parameters (geometry and demagnetizing factors, magnetic anisotropies, saturation magnetization, etc . . . ). To give an example a higher saturation magnetization of 13500 Oe (the value for a stacked NiFe/CoFe free layer FL) results in shorter bit addressing times below 280 ps but with increased half-select pulse fields around 45 Oe.

Modification of the First Embodiment

In the following a modification of the first embodiment is presented. The modification of the first embodiment uses the same device geometry as the first embodiment as shown in FIG. 2 to 4. The full and half select pulses are both applied transverse to the initial and final easy axis orientation of the magnetization M. Furthermore the full select field amplitude equals twice the half select field amplitude $H_{FS}=2\,H_{HS}$. In the first embodiment the full select pulse induced a half precessional turn of the magnetization and the half select pulse induced a full precessional turn of the magnetization. This was achieved by optimizing the pulse durations $T_{pulse}$ along with the half select field $H_{HS}$ and the full select field $H_{FS}=2 H_{HS}$ according to equations 2 to 4.

In the modification of the first embodiment the half select field pulse is still chosen to induce a full precessional turn of the magnetization: $T_{pulse}=T_{prec}(H_{HS})$. However now the full select field pulse is chosen to induce one and a half precessional turns: $T_{pulse}=1.5\,T_{Prec}(2H_{HS})$. In FIG. 12 the precession periods are plotted as a function of the transverse field. The numerical values are the same as already discussed in the first embodiment. The parameters of the calculation are the same as those of FIG. 5a, namely $\alpha=0$ and vanishing rise time of the transverse field. Along with the curves of $T_{prec}(H)$ and $\frac{1}{2} T_{prec}(2H)$ which were already presented in FIG. 5a also the curve for $1.5\,T_{prec}(2H)$ is shown. The arrow marks the point where the curve of $1.5\,T_{prec}(2H)$ intersects with the curve of $T_{prec}(H)$. Here a modified no ringing criterion is fulfilled namely:

$$T_{Pulse}=T_{prec}(H_{HS})=1.5 T_{prec}(2H_{HS}) \qquad \text{(Equation 5)}$$

for the given set of parameters Equation 5 is fulfilled at a half select field of $H_{HS}=177$ Oe. The precession period at this field is $T_{prec}(H_{HS})=340$ ps. For optimized bit addressing the bit addressing pulse duration has to be chosen accordingly, namely $T_{pulse}=T_{Prec}(H_{HS})=340$ ps.

Other modifications of the first embodiment are possible. So far the two half select pulses which were generated by the word and bit line were chosen equal in amplitude and duration. However, also different amplitudes of the two half select field pulses are possible. The no-ringing criteria established in the equations 2 to 5 will then be different but can be deduced in a straight forward manner by the person skilled in the art without the necessity of inventive skills. If the half select field amplitudes are not equal to each other the pulse durations of the two half select pulses will not be equal to each other either. Consequently the full select field pulse will be a superposition of two pulses of different duration and amplitude resulting in a more complicated full select pulse shape. Nevertheless also such a pulse structure can be optimized to induce an optimum switching trajectory with little magnetization ringing after pulse decay. Furthermore, the delay between the two half select field pulses can be varied to vary the shape of the full select field pulse and thus to optimize the switching and non-switching trajectories.

Furthermore it is within the scope of the present invention to program multiple cells of the array at the same time. To give an example a subset of the cells situated in a selected row of the array (i.e. situated along the selected word line WL) is reversed at the same time. To do so a first half select field pulse is applied via the selected word line WL. At the same time a set of second half select field pulses is applied via a set of selected bit lines BL. Consequently all cells situated at the intersection of the selected word line WL and the selected bit lines BL are reversed. All other cells of the array remain in their initial state. For all cells of the array the ringing after pulse decay is suppressed or at least strongly reduced.

SECOND EMBODIMENT

In the first embodiment the switching was induced by transverse field pulses from the word and bit lines. The switching properties of the transverse pulses were symmetric and were thus inducing a toggle action of the switching field pulses. In the second embodiment a method of magnetization reversal is disclosed which allows a direct programming of a set of selected cells of an array of cells into a predefined state regardless of the initial state of the cells. Also in this method of bit addressing of the second embodiment of the present invention the ringing of the magnetization after pulse application is reduced. The ringing is reduced in the two relevant cases namely if the magnetization is reversed by the applied magnetic field pulse and if the magnetization is not reversed by the applied magnetic field pulse.

FIG. 13 shows a magnetic memory cell according to the second embodiment of the present invention. In the magnetic memory cell array the magnetic memory cells are arranged in rows and columns. For programming the bit state of the cells the array further comprises a set of conducting word lines WL and bit lines BL running row wise and column wise, respectively. The magnetic memory cells are situated at the intersections of the word and bit line WL, BL. In the figure only an array of 5×5 memory cells is shown for clarity. Of course the number of cells in an actual array can be chosen much larger without departing from the scope of the invention.

The cells comprise at least one magnetic free layer FL consisting of a first ferromagnetic layer having a magnetic anisotropy $H_K$ wherein the magnetic anisotropy can comprise various contributions e.g. due to uniaxial anisotropy, fourfold anisotropy, surface and interface anisotropies, magnetocrystalline anisotropies, and shape anisotropy, among others. The first ferromagnetic layer of the magnetic free layer FL further comprises an easy axis of magnetization and a distribution of the magnetization M. In equilibrium conditions the magnetization M will be mainly oriented along one of the two easy axis directions. The two possible orientations of the average of the distribution of the magnetization M along the easy axis correspond to the two digital states of the cell as shown in FIG. 1.

The read out of the cells can be performed using e.g. magneto-resistive read out making use of magneto resistive effects like the GMR or TMR as known in the art. Accordingly the magnetic cell layer stacks can further comprise a magnetic pinned layer PL, a coupling layer between the free layer FL and the pinned layer PL, and other layers as known in the art of GMR and TMR stacks used for MRAM applications. The cells can further be in electrical contact to further metallization lines for reading out the magnetoresistance and thus the digital state of the cells.

Optionally the free layer FL can comprise a second ferromagnetic layer. The average magnetization of the additional ferromagnetic layer of the free layer FL may be oriented parallel or antiparallel to the orientation of the average magnetization M of the first ferromagnetic layer. This antiparallel orientation or anti-ferromagnetic behaviour can be achieved by addition of a further non-magnetic coupling layer (e.g. made of copper, ruthenium or any other suitable material) between the two ferromagnetic layers of the free layer. Such coupling layers for antiferromagnetic coupling of the two free layers are known in the art. The anti-ferromagnetic orientation of the two free layers has the advantage of reducing the stray field of the free layer of the magnetic cell and thus of reducing the coupling between neighbouring cells.

In the magnetic memory cell array of the second embodiment of the present invention the word lines WL and bit lines BL intersect under a 90° angle. The easy axis of the cells is aligned along the direction of the word line WL. Consequently, a current pulse in the word line IWL generates a magnetic field pulse along the in plane hard axis $H_{ha}$. A current pulse in the bit line IBL generates a magnetic field pulse along the easy axis $H_{ea}$.

The magnetic cell array according to the second embodiment of the present invention further comprises means for generating a first current pulse IWL at one of the word lines WL and simultaneously to the first word line pulse IWL a set of second current pulses at a plurality of bit lines BL. In a preferred embodiment the magnetic cell array further comprises means for generating a set of second pulses IBL at all bit lines BL of the array simultaneously to the generation of the first word line current pulse IWL. It is preferable that the means for generating current pulses IWL/IBL at the word and bit lines are capable of generating current pulses IWL/IBL having a duration shorter than 10 ns. It is more preferable that the means for generating the current pulses IWL/IBL are capable of generating current pulses shorter than 5 ns, 1 ns or 0.5 ns. It is preferably when the time axis of the pulse duration lies within the precession period. The duration of the pulses could e.g. determined by measuring the width of the pulse at the half of the maximum amplitude as known in the art. The term "simultaneously" as used above should mean that the pulses at the word and bit line overlap in time e.g. that the delay between the inset of two pulses is shorter than the duration of the two pulses.

In the second embodiment of the present invention a whole row of memory cells of the magnetic memory cell array (also called a "word") is programmed at the same time. In the array shown in FIG. 13 the word v is written. The word v corresponds to the cells situated along a word line WLv. To program the word v of the array of FIG. 13 a word line current pulse IWLv is applied to the word line WLv. This word line current pulse IWLv results in a magnetic field pulse $H_{ha}$ along the in plane hard axis for all cells situated in the row v of the array. At the same time bit line current pulses IBL1 . . . IBLn are applied to all bit lines BL1 . . . BLn. The bit line current pulses IBL1 . . . IBLn generate easy axis field pulses $H_{ea}1$ . . . $H_{ea}n$ at the cells of the corresponding bit lines BL1 . . . BLn. The easy axis field pulses from the different bit lines BL generally have the same amplitude but can have two different orientations. The final orientation of the magnetization M of each each bit μ of the word v to be written is determined by the orientation of the easy axis field $H_{ea}μ$ generated by the corresponding bit line BLμ (i.e. by the polarity of the bit line bit line current pulse IBLμ). A bit sequence of the word v to be written and the corresponding bit line current orientations are sketched on the bottom part of FIG. 13. Like in the prior art the easy axis fields $H_{ea}$ alone (created by the bit lines BL) are not sufficient to reverse the magnetization M of the cells situated at the corresponding bit lines. Only the combination of the easy axis bit line field $H_{ea}$ with the hard axis word line field $H_{ha}$ allows reversal of the cell magnetization. After application of the combined easy and hard axis field pulse $H_{ea}$ and $H_{ha}$ the magnetization of each cell will then be aligned along the applied easy axis field $H_{ea}$ of the corresponding bit line BLμ.

During the programming of a word the different cells of the array are subject to different magnetic field pulses. The cells can be classified in four categories a-d of different relative field orientation. Examples of the cells of the four categories are marked by the letters a-d in FIG. 13. The relative field orientations of the four categories are sketched in more detail in FIG. 14a-d.

The cells which do not belong to the word v to be written are only subject to the easy axis field generated by the bit lines BL. Depending on the initial orientation of the magnetization M of the cells along the easy axis and on the orientation of the bit line easy axis field $H_{ea}=±|H_{ea}|$ the applied easy axis field is either oriented parallel to the initial magnetization as in case a or antiparallel as in case b. In both cases the final orientation of the magnetization after pulse application should be the same as the initial one as sketched in FIGS. 14a and b.

Also in the word v to be written two different relative orientations of the field vector H and the initial orientation of the magnetization $M_i$ can occur. For all cells in the word v the applied field is the superposition of the easy axis bit line field $H_{ea}$ and the hard axis word line field $H_{ha}$. This superposition results in a tilt between the applied field H and the initial easy axis orientation $M_i$ of the magnetization as sketched in FIGS. 14c and d. Again one can distinguish between the case c where the easy axis field component $H_{ea}$ is oriented parallel to the initial easy axis orientation $M_i$ of the magnetization and the case d, or the case where the easy axis field component $H_{ea}$ is oriented antiparallel to the initial easy axis orientation $M_i$ of the magnetization. In the case c (like in the cases a and b) the applied field pulse should not lead to magnetization reversal and the initial and final magnetization states are the same. Only in case d the magnetization of the cell is to be reversed upon decay of the magnetic field pulse.

To achieve the objectives of the present invention in the second embodiment the field pulses are tailored such that the magnetization M of the free layer FL of the cells of the word v to be written which are to not be reversed upon field pulse decay (case c) perform approximately a full precessional turn about the effective field during field pulse application, and that the magnetization M of the free layer FL of the cells of the word v to be written which are to be reversed upon field pulse decay (case d) perform approximately a half precessional turn about the effective field during field pulse application.

After such a full or half precessional turn the magnetization M of the free layer FL of all cells of the word to be written is again oriented very near the easy axis. Consequently the ringing of the magnetization M of the free layer will be at least strongly reduced if not fully suppressed.

To obtain this optimal situation of a full precessional turn during pulse application for a field pulse having a parallel easy axis component (case c) and a half pressesional turn (which reverses the magnetization) during pulse application for a field pulse having an antiparallel easy axis component (case d) the parameters of the easy axis and hard axis field pulses $H_{ea}$ and $H_{ha}$ have to be adapted to the specific properties of the free layer FL of the magnetic cell.

The parameters of the field pulses which can be varied are e.g. the amplitudes of the easy axis and hard axis pulses $H_{ea}$, $H_{ha}$, the relative orientation of the field pulses with respect to the easy axis of the cells (which are linked to the orientation of the word and bit lines to the easy axis of the cells), the pulse durations $T_{Pulse}$ of the easy axis and hard axis field pulses, the rise and fall times of the easy axis and hard axis field pulses $T_{rise}$, $T_{fall}$, the shape of the easy axis and hard axis field pulses, the delay time between the application of the two easy axis and hard axis field pulses, and others.

The properties of the free layer FL which can be varied are the saturation magnetization Ms (which depends on the magnetic material of the free layer), the thickness of the free layer FL and the shape of the magnetic cell which changes the shape anisotropy of the free layer, the further material dependent anisotropies of the magnetic free layer like the uniaxial anisotropy, four-fold anisotropy, magnetocrystalline anisotropy, surface and interface anisotropies and so forth. Of further importance are the number and material properties of the further magnetic and non-magnetic layers of the free layer, the magnetic coupling of the free layer FL to the pinned layer PL and to the other layers of the cell stack, and others.

In the following an example will be shown of an optimization of the pulse parameters for a certain set of cell parameters and for the device geometry shown in FIG. 13.

Also in the second embodiment the optimized field pulse parameters are derived form numerical solutions of the Landau Lifshitz Gilbert equation (Equation 1) in a single spin model. The free layer FL of the magnetic cell is again modelled as a rotational ellipsoid of permalloy (NiFe) having a saturation magnetization of $4\pi M_S=10800$ Oe and demagnetizing factors of $N_X/4\pi=0.00615$ (easy axis), $N_Y/4\pi=0.01746$ (in-plane hard axis), and $N_Z/4\pi=0.9764$ (out of plane) corresponding to ellipsoid dimensions of 500 nm×200 nm×5 nm. In this embodiment a higher damping parameter of $\alpha=0.03$ is assumed. Such damping parameter has been experimentally observed in spin valve free layers. In the calculations of the magnetic anisotropy of the free layer only the shape anisotropy resulting from the geometry given above is taken into account. In the calculations the easy axis is along the x-axis, the intermediate axis (in plane hard axis) is along the y-axis, and hard axis (out of plane hard axis) is along the z-axis.

Initially, i.e. before pulse application the magnetization M is again oriented along the negative easy axis: $M_i=(m_X, m_Y, m_Z)=(-1, 0, 0)$. The precession period now depends on the amplitude of the applied field and on the relative orientation of the applied field with respect to the initial orientation of the magnetization $M_i$. This orientation and amplitude is given by the two in-plane components $h_X$, $h_Y$ of the applied field $H=(h_X, h_Y, 0)=(H_{ea}, H_{ha}, 0)$. $T_{Prec}(h_X, h_Y, 0)$ is again derived from the time dependent simulation of the magnetization response of the cell's free layer FL to an in-plane field step $H=(h_X, h_Y, 0)$. Here, a realistic rise time of the field step of $T_{rise}=100$ ps is used in the calculations. The such derived duration of a precession period $T_{Prec}$ is plotted in FIG. 15a (upper panel) as a grey scale map as a function of the hard axis field component $h_Y$ (horizontal axis) and of the easy axis field component $h_X$ (vertical axis). Long durations of the precession period are encoded in dark shades and short durations are encoded light in light shades (see gray scale bar legend on the right hand side). In FIG. 15b (lower panel) the duration of a half precessional period is also plotted as a gray scale map. The scales and grey scale encodings of the two maps are identical. For symmetry reasons only positive hard axis field values are plotted and $h_Y>0$.

As already mentioned the initial magnetization $M_i$ is oriented along the negative easy axis orientation (i.e. in the figures $M_i$ would point to the bottom). The case c of FIG. 14 thus corresponds to a field with a nonvanishing hard axis component $h_Y\neq 0$ and a negative easy axis component $h_X<0$.

Here the magnetization should perform approximately a full precessional turn. The relevant values are thus found in the lower half of FIG. 15a.

Conversely, case d of FIG. 14 corresponds to a field with the same non vanishing hard axis component $h_Y\neq 0$ and a positive easy axis component $h_X>0$.

Here the magnetization should perform approximately a half precessional turn. The relevant values are thus found in the upper half of FIG. 15b.

Figure 15:
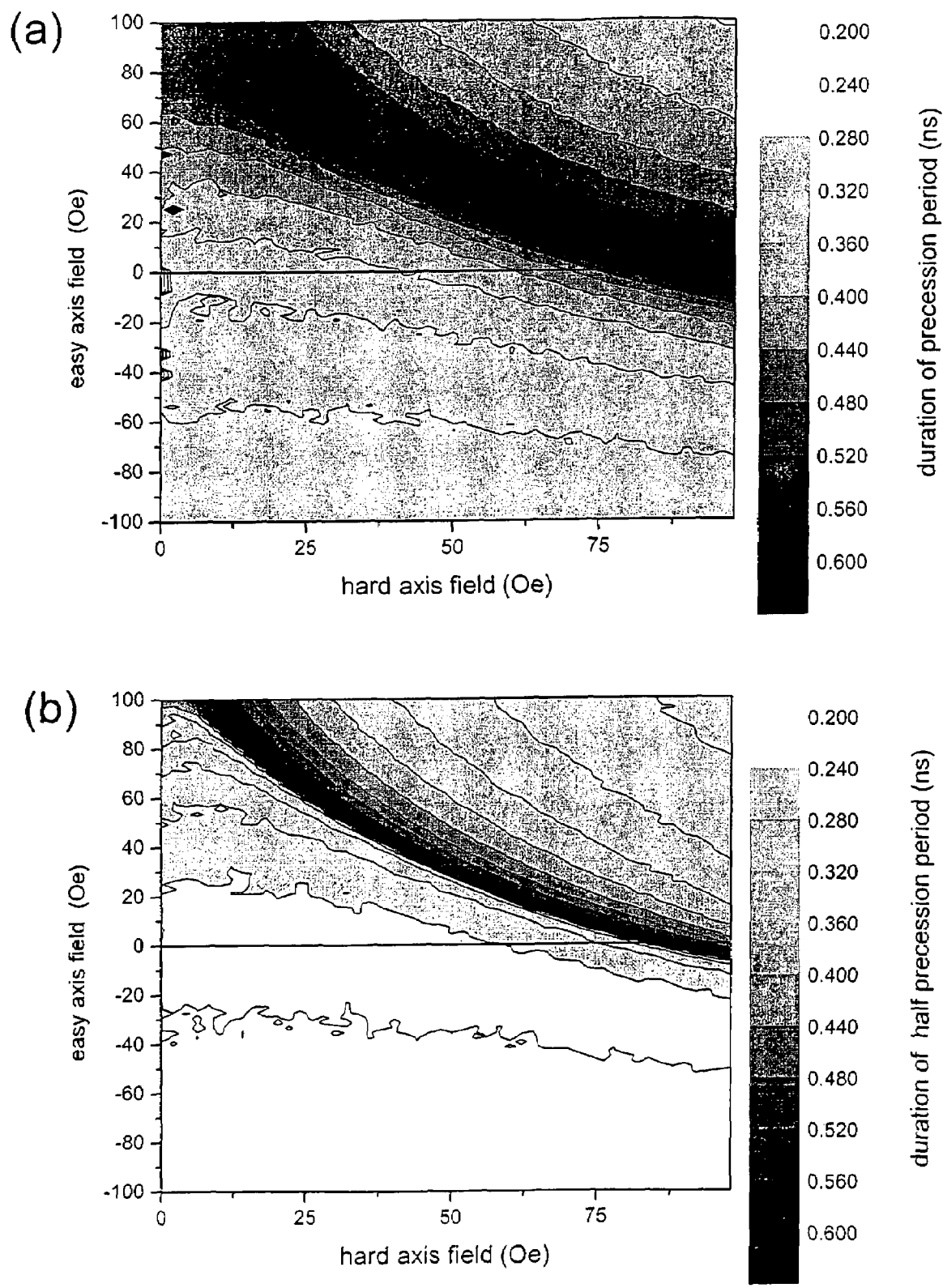

To fulfill this one has to find a pair of field values having the same hard axis component $h_Y$ and an easy axis component of opposite sign and equal absolute value $|h_X|$. In FIG. 15 the field for switching is $H_S=(h_X>0, h_Y)$ is found in FIG. 15a and the field value for non-switching $H_{NS}=(h_X<0, h_Y)$ is found in FIG. 15b. The field values must fulfill the new no-ringing criterion for the second embodiment $$T_{pulse}=T_{Prec}(H_{NS})=\tfrac{1}{2}T_{Prec}(H_S). \qquad \text{Equation 6}$$

The pulse duration $T_{pulse}$ is then chosen accordingly.

To find field values in the data of FIG. 15 which fulfil this criterion one can calculate the precession mismatch $\Delta T(\pm h_X, h_Y)$ for each field value pair $(\pm h_X, h_Y)$. The precession mismatch is the absolute value of the difference of duration of the half of the precession period at positive easy axis fields $h_X>0$ and of the duration of the full precession period at negative easy axis fields $h_X<0$: $\Delta T=|\tfrac{1}{2}T_{Prec}(h_X>0, h_Y)-T_{Prec}(h_X<0, h_Y)|$. If $\Delta T=0$ the durations of the half and the full precession period at the field value pair is exactly the same and Equation 6 is fulfilled.

In FIG. 16a the precession mismatch $\Delta T(\pm h_X, h_Y)$ is displayed in a grey scale map. $\Delta T$ is only relevant in the upper half i.e. for $h_Y>0$ (as the two relevant parts of $\tfrac{1}{2}T_{Prec}(h_X>0, h_Y)$ and of $T_{Prec}(h_X<0, h_Y)$ are mapped into this half of FIG. 16a). In the black region marked by the arrow the precession mismatch is smaller than 10 ps. Here, Equation 6 is approximately fulfilled which is a pre-requisite for a optimized bit addressing according to this embodiment of the present invention.

The second prerequisite is that the switch field value $H_S$ results in magnetization reversal and that the ringing upon switch pulse application is reduced or suppressed. In FIG. 16b the switch field limit and the region of possible ringing free trajectories are marked. The region which allows switching is marked in grey. The region where no-ringing trajectories are possible is marked in black. The field value $(\pm h_X, h_Y)$ should thus ideally be chosen from the black region of the no-ringing switching trajectories.

In FIG. 17 the relevant parts of FIGS. 16a and b are displayed in the same plot. Both the region of small precession mismatch $\Delta T<10$ ps and the region of no-ringing switching are hatched. The two regions overlap at a field range around $|h_X|\approx 26\text{-}36$ Oe and $h_Y\approx 77\text{-}81$ Oe as marked by the arrow. In this field range optimized bit addressed magnetization reversal in the array is possible if the pulse duration $T_{pulse}$ of the easy and hard axis pulses is properly matched to the duration of the precession times according to equation 6.

In FIG. 18 an example of such optimized bit addressing pulses is shown in the upper panel. The pulse duration of the hard and easy axis pulses is $T_{Pulse}=325$ ps measured at half of the maximum amplitude. The fall and rise times of the pulse are $T_{rise}=T_{fall}=100$ ps. The pulse starts to rise at the time 0 ps and fully decays to zero at a time of 425 ps. The amplitude of the hard axis field pulse is $h_Y=78$ Oe. The amplitude of the easy axis field pulse is $h_X=+28$ Oe. In the four lower panels a-d of FIG. 18 the easy axis component $m_X$ of the magnetization M is plotted as a function of time. The relative field orientation in four panels a-d are sketched in the pictograms on the right hand side. They correspond to the four cases a-d marked in FIGS. 13 and 14. In all cases the initial orientation of the magnetization is aligned along negative easy axis and $m_X = -1$.

In case a only a bit line field pulse is acting on the magnetization M of the free layer FL. The magnetic field pulse magnetization is applied parallel to the initial magnetization. Consequently, the torque on the magnetization M according to equation 1 is zero and no precession of the magnetization occurs and the magnetization is not reversed upon field pulse decay ($m_X = -1$).

Also in case b only a bit line field pulse is acting on the magnetization M. Now the field is applied antiparallel to the initial magnetization. Also in this case the torque on the magnetization according to equation 1 is zero. Furthermore the applied easy axis field is well below the easy axis switch field threshold and unintentional programming of the bit is practically impossible. Consequently, practically no magnetization precession occurs and the magnetization is not reversed upon field pulse decay ($m_X = -1$).

In case c the applied field components are $h_X = -28$ Oe and $h_Y = 78$ Oe. The easy axis component is thus oriented parallel to the initial magnetization. Here the magnetization performs approximately a full precessional turn about the effective field during pulse application. Due to this full precessional turn the magnetization is oriented very near the initial easy axis upon pulse decay and only very little ringing of the magnetization after pulse application occurs. A slight remaining ringing is however inevitable due to the finite damping of $\alpha = 0.03$. The damping results in a relaxation of the magnetization towards the effective field during precession and thus in a small tilt of the magnetization M out of the easy axis upon pulse decay. However, the ringing is not very pronounced and is hardly observable in the figure. Furthermore the magnetization is not reversed upon field pulse decay ($m_X = -1$).

In case d the applied field components are $h_X = +28$ Oe and $h_Y = 78$ Oe. The easy axis component is thus oriented antiparallel to the initial magnetization. Here the magnetization performs approximately a half precessional turn about the effective field during pulse application. After the half precessional turn the magnetization is now oriented very near the reversed easy axis ($m_X = +1$) upon pulse decay and practically no ringing of the magnetization after pulse application occurs. The ringing is even weaker than in the case c as the pulse fields are chosen from the region of the no-ringing trajectories allowing a very good alignment of the magnetization M along the reversed easy axis direction upon pulse decay.

As already pointed out due to the simultaneous field pulse application, these four cases cover all possible relative field orientations and thus all possible magnetization trajectories which occur in the cell array. Consequently, after the programming of a word according to the present invention in all cells of the array the ringing is practically fully suppressed and the following word could be written immediately. The achievable write rates could thus be well above 1 GHz per word and thus of several GHz per bit (depending on the number of bits per word). Also the read out of any of the cells of the array could be performed immediately upon writing of the word as all the cells are very near their equilibrium position and the read-out signal is thus stabilized.

Like in the first embodiment the numerical values for optimized bit addressing of this embodiment (pulse duration, pulse amplitudes, etc . . . ) depend strongly on the magnetic device parameters (geometry and demagnetizing factors, magnetic anisotropies, saturation magnetization, etc . . . ). Furthermore it should be mentioned that e.g. the position of the no-ringing trajectories as plotted in FIGS. 16 and 17 depends on the damping parameter.

Further modifications of the second embodiment are possible. So far, e.g the bit line pulses which were chosen equal in amplitude and duration. However, also different amplitudes of the two half select field pulses are possible. The field values for optimized bit addressing will then be different but can be deduced in a straight forward manner by the person skilled in the art without the necessity of inventive skills. Furthermore, the delay between the two bit line and the word line field pulses can be varied to vary the shape of the full select field pulse and thus to optimize the switching and non-switching trajectories.

In the two embodiments it was shown that an optimized bit addressing in a magnetic memory cell array can be achieved if the precession period $T_{prec}(H_{NS})$ of the magnetization under application of a field pulse $H_{NS}$ which does not reverse the magnetization of the cell approximately matches the half of the precession Period $\frac{1}{2}T_{Prec}(H_S)$ of the magnetization under application of a field pulse $H_S$ which does reverse the magnetization.

It is preferable that the precession mismatch $\Delta T = |\frac{1}{2}T_{Prec}(H_S) - T_{Prec}(H_{NS})|$ is less than 100 ps. In a more preferable case the precession mismatch is less than 50 ps. In a more preferable case the precession mismatch is less than 20 ps. In a more preferable case the precession mismatch is less than 10 ps.

Furthermore it is preferable that the pulse duration of the field pulses for switching and/or for non switching are approximately matched to the duration of the half precession period at the field which induces magnetization reversal $H_S$.

The invention claimed is:

1. Method of magnetization reversal of the magnetization (M) of at least one first magnetic memory element of an array of magnetic memory elements comprising the steps of:

applying a first magnetic field pulse to a first set of magnetic memory elements, and applying a second magnetic field pulse to a second set of magnetic memory elements, such that during the application of the first and second magnetic field pulse the magnetization (M) of said first magnetic memory element which is to be reversed upon the field pulse decay performs approximately an odd number of a half precessional turn, characterized in that the magnetization (M) of at least one second magnetic memory element which is not to be reversed upon the field pulse decay performs approximately an even number of a full precessional turn.

2. Method according to claim 1, characterized in that the first and second magnetic field pulses are designed such that the first and second magnetic field pulses induce a full precessional turn of the magnetization (M) of a free layer (FL) of a corresponding magnetic memory element and such that the superposition of at least the first and second field pulse induces a half precessional turn of the magnetization (M) of the free layer (FL) which reverses the magnetization (M) of the free layer (FL) of the selected magnetic memory element.

3. Method according to claim 1, characterized in programming a set of magnetic memory elements at the same time by applying a plurality of first and second magnetic field pulses to the array of magnetic memory elements, wherein the magnetic field pulses are applied such that the magnetization (M) of the magnetic memory elements which are to be reversed performs a half precessional turn during field pulse application and the magnetization (M) of the magnetic memory elements which are not to be reversed performs a full precessional turn during the magnetic field pulse application.

4. Method according to claim 1, characterized in that the precession period ($T_{prec}(H_{NS})$) of the magnetization (M) under application of an magnetic field pulse ($H_{NS}$) which does not reverse the magnetization (M) of the magnetic memory element approximately matches the half of the precession period ($\frac{1}{2}T_{Prec}(H_S)$) of the magnetization (M) under application of an effective magnetic field pulse ($H_S$) which does reverse the magnetization (M) of the magnetic memory element.

5. Method according to claim 4, characterized in that the precession period mismatch $\Delta T = \frac{1}{2} \cdot T_{Prec}(H_S) - T_{Prec}(H_{NS})$ being the difference between the half of the duration of said first precession period ($\frac{1}{2} \cdot T_{Prec}(H_S)$) and the duration of said full precession period ($T_{Prec}(H_{NS})$) is shorter than 100 ps ($\Delta T < 100$ ps).

6. Method according to claim 1, characterized in that the pulse duration of the field pulses for reversing the magnetization (M) and/or for non reversing the magnetization (M) are approximately matched to the duration of the half precession period at the field ($H_S$) which induces magnetization reversal.

7. Method according to claim 1, characterized in that the magnetic field pulses are oriented perpendicular to the initial and final easy axis of magnetization (M) of the magnetic memory elements of the array.

8. Method according to claim 1, characterized in that the applied magnetic field pulses have the same amplitude ($H_{HS,BL} = H_{HS,WL} = H_{HS}$) and the same pulse duration ($T_{HS,BL} = T_{HS,WL} = T_{HS}$).

9. Method according to claim 1, characterized in that the half precessional turn is in the range of 140° to 260° and/or that the full precessional turn is in the range of 320° to 400° about the effective magnetic field ($H_{eff}$) applied to the respective magnetic memory element.

* * * * *